United States Patent
Xia et al.

(10) Patent No.: US 8,194,750 B2
(45) Date of Patent: Jun. 5, 2012

(54) SYSTEM AND METHOD FOR DIGITAL COMMUNICATION HAVING A CIRCULANT BIT INTERLEAVER FOR EQUAL ERROR PROTECTION (EEP) AND UNEQUAL ERROR PROTECTION (UEP)

(75) Inventors: Pengfei Xia, Mountain View, CA (US); Chiu Ngo, San Francisco, CA (US)

(73) Assignee: Samsung Electronics Co., Ltd., Suwon (KR)

( * ) Notice: Subject to any disclaimer, the term of this patent is extended or adjusted under 35 U.S.C. 154(b) by 1337 days.

(21) Appl. No.: 11/835,302

(22) Filed: Aug. 7, 2007

(65) Prior Publication Data
US 2008/0089427 A1    Apr. 17, 2008

Related U.S. Application Data

(60) Provisional application No. 60/852,051, filed on Oct. 16, 2006.

(51) Int. Cl.
*H04N 7/12* (2006.01)
*H04N 11/02* (2006.01)
*H04N 11/04* (2006.01)

(52) U.S. Cl. .......... 375/240.24; 375/240.27; 375/240.01

(58) Field of Classification Search .................. None
See application file for complete search history.

(56) References Cited

U.S. PATENT DOCUMENTS
4,665,436 A    5/1987 Osborne et al.
(Continued)

FOREIGN PATENT DOCUMENTS
EP    0537932 A2    4/1993
(Continued)

OTHER PUBLICATIONS

S. Rekh, et al. "Optimal choice of interleaver for turbo codes," Academic Open Internet Journal, vol. 15, 2005, see section III. Accessed Aug. 29, 2011, retrieved [http://www.acadjournal.com/2005/v15/part6/p7].*

(Continued)

*Primary Examiner* — Kaveh Abrishamkar
*Assistant Examiner* — Robert Leung
(74) *Attorney, Agent, or Firm* — Kenneth L. Sherman, Esq.; Michael Zarrabian, Esq.; Sherman & Zarrabian LLP

(57) ABSTRACT

A system and method for processing uncompressed high definition video data to be transmitted over a wireless medium is disclosed. In one embodiment, the system includes i) a plurality of convolutional encoders configured to input a plurality of video data streams and output a plurality of encoded data streams, respectively, wherein each data stream includes a plurality of data bits, ii) a group multiplexer configured to multiplex the plurality of encoded data streams into a multiplexed data stream, wherein the group multiplexer is further configured to multiplex a plurality of data bits together at one time and iii) a circulant bit interleaver configured to receive an m×n data stream block having n columns and m rows or convert the multiplexed data stream to an m×n data stream block, wherein the m×n data stream block comprises m×n data bits, and wherein the bit interleaver is further configured to interleave the received data bits diagonally and in a circulant manner with respect to the m×n block. The circulant bit interleaver interleaves the multiplexed data bits such that all data bits in one QAM symbol come from different convolutional encoders.

32 Claims, 13 Drawing Sheets

U.S. PATENT DOCUMENTS

| | | | |
|---|---|---|---|
| 5,007,001 | A | 4/1991 | Lloyd-Williams |
| 5,105,442 | A * | 4/1992 | Wei .......................... 375/262 |
| 5,287,470 | A | 2/1994 | Simpson |
| 5,293,480 | A | 3/1994 | Miller et al. |
| 5,340,988 | A | 8/1994 | Kingsley et al. |
| 5,508,752 | A | 4/1996 | Kim et al. |
| 5,598,432 | A | 1/1997 | Wei |
| 5,691,995 | A | 11/1997 | Ikeda et al. |
| 5,907,582 | A | 5/1999 | Yi |
| 6,141,384 | A | 10/2000 | Wittig et al. |
| 6,240,212 | B1 | 5/2001 | Son et al. |
| 6,553,540 | B1 | 4/2003 | Schramm et al. |
| 6,741,748 | B1 | 5/2004 | Son et al. |
| 6,810,084 | B1 | 10/2004 | Jun et al. |
| 6,859,545 | B1 | 2/2005 | Wu |
| 6,920,179 | B1 | 7/2005 | Anand et al. |
| 7,039,852 | B2 | 5/2006 | Dent |
| 7,095,708 | B1 | 8/2006 | Alamouti et al. |
| 7,100,182 | B2 | 8/2006 | Choi et al. |
| 7,170,849 | B1 | 1/2007 | Arvoli et al. |
| 7,228,154 | B2 | 6/2007 | Champion et al. |
| 7,337,386 | B2 | 2/2008 | Chang et al. |
| 7,376,117 | B2 | 5/2008 | Erlich et al. |
| 7,450,612 | B2 | 11/2008 | Floriach et al. |
| 7,535,819 | B1 | 5/2009 | Larsson |
| 7,693,034 | B2 | 4/2010 | Singh et al. |
| 7,742,535 | B2 | 6/2010 | Braithwaite |
| 7,991,056 | B2 | 8/2011 | Hansen et al. |
| 8,006,168 | B2 * | 8/2011 | Reznic et al. .................. 714/774 |
| 2001/0030939 | A1 | 10/2001 | Vijayan et al. |
| 2002/0053049 | A1 | 5/2002 | Shiomoto et al. |
| 2003/0091109 | A1 | 5/2003 | Okunev et al. |
| 2004/0015773 | A1 | 1/2004 | D'Arcy et al. |
| 2004/0047424 | A1 | 3/2004 | Ramaswamy et al. |
| 2004/0120349 | A1 | 6/2004 | Border et al. |
| 2004/0131125 | A1 | 7/2004 | Sanderford et al. |
| 2004/0151146 | A1 | 8/2004 | Hammerschmidt |
| 2005/0101319 | A1 | 5/2005 | Murali et al. |
| 2005/0135611 | A1 | 6/2005 | Hardacker |
| 2005/0154967 | A1 | 7/2005 | Heo et al. |
| 2005/0232137 | A1 | 10/2005 | Hosur et al. |
| 2005/0249183 | A1 | 11/2005 | Danon et al. |
| 2005/0265469 | A1 | 12/2005 | Aldana et al. |
| 2006/0002486 | A1 | 1/2006 | Van Nee et al. |
| 2006/0005106 | A1 | 1/2006 | Lane et al. |
| 2006/0107171 | A1 | 5/2006 | Skraparlis |
| 2006/0212773 | A1 | 9/2006 | Aytur et al. |
| 2006/0281487 | A1 | 12/2006 | Girardeau et al. |
| 2007/0115797 | A1 | 5/2007 | Reznic et al. |
| 2007/0160139 | A1 | 7/2007 | Vasquez et al. |
| 2007/0223572 | A1 | 9/2007 | Xia et al. |
| 2007/0260660 | A1 | 11/2007 | Su |
| 2007/0286103 | A1 | 12/2007 | Niu et al. |
| 2007/0288980 | A1 | 12/2007 | Niu et al. |
| 2008/0002782 | A1 | 1/2008 | Niu et al. |
| 2009/0016359 | A1 | 1/2009 | Niu et al. |
| 2009/0022079 | A1 | 1/2009 | Zhou et al. |
| 2009/0323563 | A1 | 12/2009 | Ho et al. |

FOREIGN PATENT DOCUMENTS

| | | |
|---|---|---|
| JP | 2001-251199 | 9/2001 |
| JP | 2003-179887 | 6/2003 |
| JP | 2006157898 | 6/2006 |
| WO | WO 02/35853 A2 | 5/2002 |
| WO | WO 2004/049581 A2 | 6/2004 |
| WO | WO 2005/036790 A1 | 4/2005 |
| WO | 2005041420 A1 | 5/2005 |
| WO | WO 2005/076536 A1 | 8/2005 |
| WO | WO 2006/007571 A1 | 1/2006 |
| WO | WO 2006/020741 A2 | 2/2006 |
| WO | WO 2007/111442 A1 | 10/2007 |
| WO | WO 2008/111707 A1 | 9/2008 |

OTHER PUBLICATIONS

Y. C. Chang, et al. "A Low-Complexity Unequal Error Protection of H.264/AVC Video Using Adaptive Hieratchical QAM," Nov. 2006, IEEE Transactions on Consumer Electronics, vol. 52, Issue 4.*

"Digital Video Broadcasting: Framing structure, channel coding and modulation for digital terrestrial television", ETSI EN 300 744, Jan. 2001.

Forney, G., "Burst Correcting Codes for Classic Bursty Channel," IEEE Trans. on Communications Technology, vol. 19, No. 5, Oct. 1971.

Chu et al., "Inside the FFT Black Box—Serial and Parallel Fast Fourier Transform Algorithms", Computational Mathematics Series, CRC Press 2000, (Content pages only).

Hachman, "CE Giants back Amimon's Wireless HDTV Tech," online: www.pcmag.com, 1 page, Jul. 23, 2008.

LG Electronics Inc., WirelessHD Specification Version 1.0 Overview, Oct. 9, 2007, 77 pages.

NEC develops compact milimeter-wave transceiver for uncompressed HDTV signal transmission, NE Asia Online, Apr. 5, 2005, (Downloaded from http://neasia/nikkeibp.com/topstory/00913 on Sep. 29, 2006).

International Search Report dated Oct. 10, 2007 for International Application No. PCT/KR2007/003125, filed Jun. 27, 2007.

International Preliminary Report on Patentability and Written Opinion dated Jan. 6, 2009 for PCT/KR2007/003125, filed Jun. 27, 2007.

International Search Report dated Jul. 16, 2007 for PCT/KR2007/001419, filed Mar. 23, 2007.

International Preliminary Report on Patentability and Written Opinion dated Sep. 30, 2008 for PCT/KR2007/001419, filed Mar. 23, 2007.

U.S. Office Action dated Aug. 28, 2009 in U.S. Appl. No. 11/776,506 filed Jul. 11, 2007.

U.S. Office Action dated Jun. 1, 2009 in U.S. Appl. No. 11/724,735, filed Mar. 15, 2007.

U.S. Office Action dated Dec. 11, 2009 in U.S. Appl. No. 11/724,735, filed Mar. 15, 2007.

Fischer, W., "Digital Video and Audio Broadcasting Technology: A Practical Engineering Guide," Second Edition, 2008, pp. 98-108, United States.

Caetano, L., "SiBEAM—60 GHz Architecture for Wireless Video Display," SiBEAM, Inc., White Paper, Mar. 2006, pp. 1-6, United States.

U.S. Non-Final Office Action for U.S. Appl. No. 11/717,334 mailed on Jul. 9, 2010.

U.S. Non-Final Office Action for U.S. Appl. No. 11/717,334 mailed on Oct. 18, 2010.

U.S. Non-Final Office Action for U.S. Appl. No. 11/724,760 mailed Jun. 28, 2010.

International Search Report for International Application No. PCT/KR2008/000886 dated May 21, 2008 by Korean Intellectual Property Office.

International Search Report for PCT/KR2007/003172 dated on Nov. 19, 2007.

Babak Hassibi and Bertrand M. Hochwald, "How Much Training is Needed in Multiple-Antenna Wireless Links?", IEEE Transactions on Information Theory, vol. 49, No. 4, Apr. 2003.

Pengfei Xia et al., "Adaptive MIMO-OFDM Based on Partial Channel State Information", IEEE Transactions on signal processing, vol. 52, No. 1, Jan. 2004.

Pengfei Xia et al., "Achieving the Welch Bound With Difference Sets", IEEE Transactions on Information Theory, vol. 51, No. 5, May 2005.

FreshNews.com, SiBEAM Receives Equity Investment from Best Buy, http://freshnews.com/print/node/261440, Jan. 4, 2010, 2 pages.

U.S. Office Action dated Feb. 23, 2010 in U.S. Appl. No. 11/717,334, filed Mar. 12, 2007.

U.S. Notice of Allowance for U.S. Appl. No. 11/717,334 mailed on Sep. 30, 2011.

Aramvith. S. et al., "Wireless Video Transport Using Conditional Retransmission and Low-Delay Interleaving," IEEE Transactions on Circuits and Systems for Video Technology, Jun. 2002, pp. 558-565, vol. 12, No. 6, IEEE, United States.

Baqai, S. et al., "Error Resilience of EZW Coder for Image Transmission in Lossy Networks," Proceedings of the IEEE Fourth International Symposium on Multimedia Software Engineering (MSE'02), 2002, pp. 328-333, IEEE, United States.

International Preliminary Report on Patentability and Written Opinion dated Feb. 9, 2010 for International Application No. PCT/KR2008/000886, filed Feb. 9, 2010, pp. 1-7, Korean Intellectual Property Office, Seo-gu, Daejeon, Republic of Korea.

Chinese Non-Final Office Action dated Dec. 25, 2009 for Chinese Application No. 2007100894894, pp. 1-5, Chinese Patent Office, People's Republic of China [Machine-language translation included, 2 p.].

Mexican Notice of Allowance dated Aug. 26, 2010 for Mexican Application No. MX/A/2008/016536, pp. 1-2, Mexican Institute of Industrial Property, United Mexican States [Machine-language translation submitted, 1p.].

Korean Decision to Grant dated Aug. 18, 2010 issued in Korean Patent Application No. 10-2008-7013962, pp. 1-5, Korean Intellectual Property Office, Seo-gu, Daejeon, Republic of Korea [Machine-language translation included, 3 p.].

Korean Non-Final Office Action dated Feb. 23, 2010 issued in Korean Patent Application No. 10-2008-7013962, pp. 1-5, Korean Intellectual Property Office, Seo-gu, Daejeon, Republic of Korea [Machine-language translation included, 5 p.].

U.S. Non-Final Office Action for U.S. Appl. No. 11/725,381 mailed on Jul. 13, 2011.

U.S. Final Office Action for U.S. Appl. No. 11/717,334 mailed on Mar. 29, 2011.

U.S. Notice of Allowance for U.S. Appl. No. 11/717,334 mailed on Jun. 16, 2011.

* cited by examiner

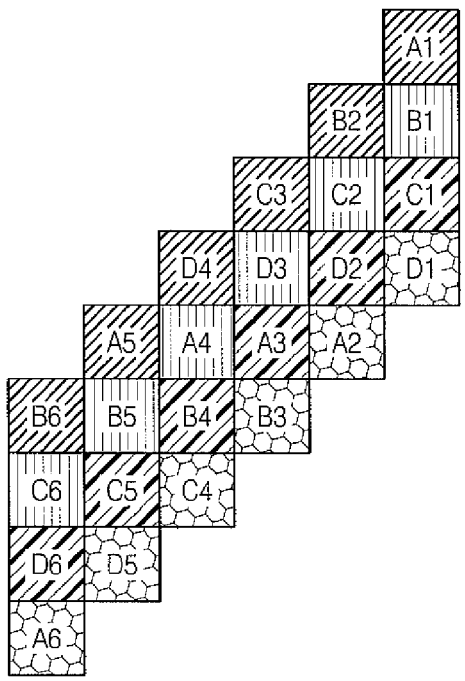
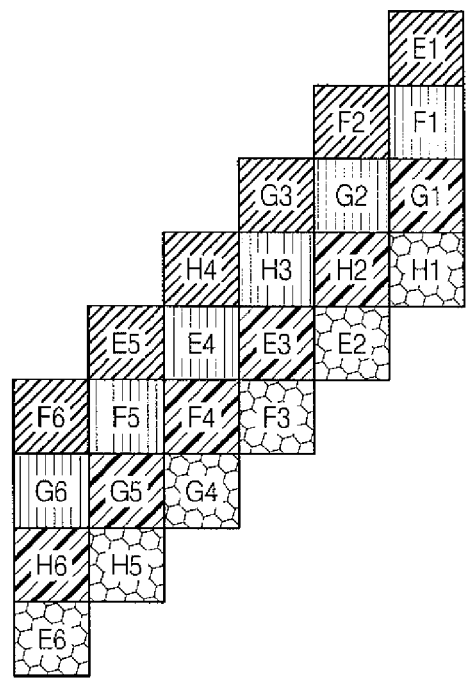
FIG. 9A  FIG. 9B
FIG. 10 numbering increase in order

FIG. 15

| numbering | 1 | 2 | 3 | 4 | 5 | 6 | 7 | 8 | 9 | 10 | 11 | 12 |
|---|---|---|---|---|---|---|---|---|---|---|---|---|
| labeling | A1 | A2 | A3 | A4 | A5 | A6 | A7 | B1 | B2 | B3 | B4 | B5 |
| numbering | 13 | 14 | 15 | 16 | 17 | 18 | 19 | 20 | 21 | 22 | 23 | 24 |
| labeling | B6 | B7 | C1 | C2 | C3 | C4 | C5 | C6 | C7 | D1 | D2 | D3 |
| numbering | 25 | 26 | 27 | 28 | 29 | 30 | 31 | 32 | 33 | 34 | 35 | 36 |
| labeling | D4 | D5 | D6 | D7 | E1 | E2 | E3 | E4 | E5 | F1 | F2 | F3 |
| numbering | 37 | 38 | 39 | 40 | 41 | 42 | 43 | 44 | 45 | 46 | 47 | 48 |
| labeling | F4 | F5 | G1 | G2 | G3 | G4 | G5 | H1 | H2 | H3 | H4 | H5 |

FIG. 16 column wise readout (from top to bottom) in this direction →

| A1 | E1 | C7 | B6 | E5 | D4 | A5 | H2 | F4 | B2 | I MSB |
|---|---|---|---|---|---|---|---|---|---|---|
| B1 | F3 | D7 | C6 | G2 | E4 | B5 | A4 | H1 | C3 | I LSB |
| C1 | A7 | F2 | D6 | H4 | G1 | E3 | B4 | A3 | G5 | D3 | Q MSB |
| D1 | B7 | G4 | F1 | A6 | H3 | F5 | C4 | B3 | A2 | E2 | Q LSB |

| numbering | 1 | 2 | 3 | 4 | 5 | 6 | 7 | 8 | 9 | 10 | 11 | 12 |
|---|---|---|---|---|---|---|---|---|---|---|---|---|
| labeling | B8 | B9 | B10 | B11 | B12 | B13 | B14 | C8 | C9 | C10 | C11 | C12 |
| numbering | 13 | 14 | 15 | 16 | 17 | 18 | 19 | 20 | 21 | 22 | 23 | 24 |
| labeling | C13 | C14 | D8 | D9 | D10 | D11 | D12 | D13 | D14 | A8 | A9 | A10 |
| numbering | 25 | 26 | 27 | 28 | 29 | 30 | 31 | 32 | 33 | 34 | 35 | 36 |
| labeling | A11 | A12 | A13 | A14 | F6 | F7 | F8 | F9 | F10 | G6 | G7 | G8 |
| numbering | 37 | 38 | 39 | 40 | 41 | 42 | 43 | 44 | 45 | 46 | 47 | 48 |
| labeling | G9 | G10 | H6 | H7 | H8 | H9 | H10 | E6 | E7 | E8 | E9 | E10 |

FIG. 17

| | | | | | | | | | | | | |
|---|---|---|---|---|---|---|---|---|---|---|---|---|
| B8 | F6 | D14 | C13 | H8 | F10 | A11 | B12 | E7 | G9 | D10 | C9 | I MSB |
| C8 | G8 | A14 | D13 | E10 | H7 | F9 | C12 | B11 | E6 | A10 | D9 | I LSB |
| D8 | B14 | G7 | A13 | D12 | E9 | H6 | F8 | C11 | B10 | H10 | A9 | Q MSB |
| A8 | C14 | H9 | G6 | A12 | B13 | E8 | G10 | D11 | C10 | B9 | F7 | Q LSB | column wise readout (from top to bottom) in this direction →

FIG. 18

SYSTEM AND METHOD FOR DIGITAL COMMUNICATION HAVING A CIRCULANT BIT INTERLEAVER FOR EQUAL ERROR PROTECTION (EEP) AND UNEQUAL ERROR PROTECTION (UEP)

RELATED APPLICATIONS

This application claims priority under 35 U.S.C. §119(e) from U.S. Provisional Patent Application No. 60/852,051 filed on Oct. 16, 2006, which is hereby incorporated by reference. This application also relates to i) U.S. patent application Ser. No. 11/724,760 filed on Mar. 15, 2007 and ii) U.S. patent application Ser. No. 11/776,506 filed on Jul. 11, 2007, both of which are incorporated herein by reference.

BACKGROUND OF THE INVENTION

1. Field of the Invention

The present invention relates to wireless transmission of video information, and in particular, to transmission of uncompressed high definition video information over wireless channels.

2. Description of the Related Technology

With the proliferation of high quality video, an increasing number of electronic devices, such as consumer electronic devices, utilize high definition (HD) video which can require about 1 Gbps (bits per second) in bandwidth for transmission. As such, when transmitting such HD video between devices, conventional transmission approaches compress the HD video to a fraction of its size to lower the required transmission bandwidth. The compressed video is then decompressed for consumption. However, with each compression and subsequent decompression of the video data, some data can be lost and the picture quality can be reduced.

The High-Definition Multimedia Interface (HDMI) specification allows transfer of uncompressed HD signals between devices via a cable. While consumer electronics makers are beginning to offer HDMI-compatible equipment, there is not yet a suitable wireless (e.g., radio frequency) technology that is capable of transmitting uncompressed HD video signals. Wireless local area network (WLAN) and similar technologies can suffer interference issues when several devices, which do not have the bandwidth to carry the uncompressed HD signals, are connected to the network.

SUMMARY OF CERTAIN INVENTIVE ASPECTS

One aspect of the invention provides a wireless HD video transmitter system which includes a group multiplexer and a circulant bit interleaver which can effectively improve the physical layer performance, as well as simplify hardware complexity.

Another aspect of the invention provides a system for processing high definition video data to be transmitted over a wireless medium, the system comprising: i) a plurality of convolutional encoders configured to input a plurality of video data streams and output a plurality of encoded data streams, respectively, wherein each data stream includes a plurality of data bits, ii) a group multiplexer configured to multiplex the plurality of encoded data streams into a multiplexed data stream, wherein the group multiplexer is further configured to multiplex a plurality of data bits together at one time, iii) a circulant bit interleaver configured to receive an m×n data stream block having n columns and m rows or convert the multiplexed data stream to an m×n data stream block, wherein the m×n data stream block comprises m×n data bits, and wherein the bit interleaver is further configured to interleave the received data bits diagonally and in a circulant manner with respect to the m×n block and iv) a quadrature amplitude modulation (QAM) mapper configured to perform QAM mapping for the interleaved data.

Another aspect of the invention provides a method of processing high definition video data to be transmitted over a wireless medium, the method comprising: i) convolutional encoding a plurality of video data streams in parallel into a plurality of encoded data streams, wherein each data stream includes a plurality of data bits, ii) group multiplexing the plurality of encoded data streams into a multiplexed data stream, wherein a plurality of data bits are multiplexed together at one time, iii) receiving an m×n data stream block having n columns and m rows or converting the multiplexed data stream to an m×n data stream block, wherein the m×n data stream block comprises m×n data bits, iv) interleaving the received data bits diagonally and in a circulant manner with respect to the m×n block and v) performing quadrature amplitude modulation (QAM) mapping for the interleaved data.

Another aspect of the invention provides one or more processor-readable storage devices having processor-readable code embodied on the processor-readable storage devices, the processor-readable code for programming one or more processors to perform a method of processing high definition video data to be transmitted over a wireless medium, the method comprising: i) convolutional encoding a plurality of video data streams in parallel into a plurality of encoded data streams, wherein each data stream includes a plurality of data bits, ii) group multiplexing the plurality of encoded data streams into a multiplexed data stream, wherein a plurality of data bits are multiplexed together at one time, iii) receiving an m×n data stream block having n columns and m rows or converting the multiplexed data stream to an m×n data stream block, wherein the m×n data stream block comprises m×n data bits, iv) interleaving the received data bits diagonally and in a circulant manner with respect to the m×n block and v) performing quadrature amplitude modulation (QAM) mapping for the interleaved data.

Still another aspect of the invention provides a system for processing high definition video data to be transmitted over a wireless medium, the system comprising: i) an outer encoder configured to outer encode a received video data stream into a first encoded data stream, ii) an outer interleaver configured to outer interleave the first encoded data stream, iii) a plurality of inner encoders configured to input a plurality of video data streams and output a plurality of encoded data streams, respectively, wherein each data stream includes a plurality of data bits, iv) a group multiplexer configured to multiplex the plurality of encoded data streams into a multiplexed data stream, wherein the group multiplexer is further configured to multiplex a plurality of data bits together at one time, v) a circulant bit interleaver configured to receive an m×n data stream block having n columns and m rows or convert the multiplexed data stream to an m×n data stream block, wherein the m×n data stream block comprises m×n data bits, and wherein the bit interleaver is further configured to interleave the received data bits diagonally and in a circulant manner with respect to the m×n block and vi) a quadrature amplitude modulation (QAM) mapper configured to perform QAM mapping for the interleaved data.

Yet another aspect of the invention provides a system for processing high definition video data to be transmitted over a wireless medium, the system comprising: i) a source for a data stream having a plurality of blocks of data and ii) a circulant bit interleaver configured to receive an m×n data stream block having n columns and m rows from the source or convert a received data block to an m×n data stream block, wherein the m×n data stream block comprises m×n data bits, and wherein the bit interleaver is further configured to interleave the received data bits diagonally and in a circulant manner with respect to the m×n block.

BRIEF DESCRIPTION OF THE DRAWINGS

FIGS. 9A and 9B illustrate conceptual diagrams showing the read out order of the circulant interleaver for the UEP modulation mode.

FIG. 10 illustrates a conceptual diagram showing the 16QAM constellation mapping of the interleaved bits for the UEP modulation mode.

FIG. 15 illustrates a conceptual diagram showing numbering and labeling of the multiplexing scheme for the UEP coding mode (first half cycle) according to another embodiment of the invention.

FIG. 16 illustrates a conceptual diagram showing the overall multiplexing and bit interleaving pattern in the first half cycle.

FIG. 17 illustrates a conceptual diagram showing numbering and labeling of the multiplexing scheme for the UEP coding mode (second half cycle) according to another embodiment of the invention.

FIG. 18 illustrates a conceptual diagram showing the overall multiplexing and bit interleaving pattern in the second half cycle.

DETAILED DESCRIPTION OF CERTAIN INVENTIVE EMBODIMENTS

Certain embodiments provide a method and system for transmission of uncompressed HD video information from a sender to a receiver over wireless channels.

Figure 1:
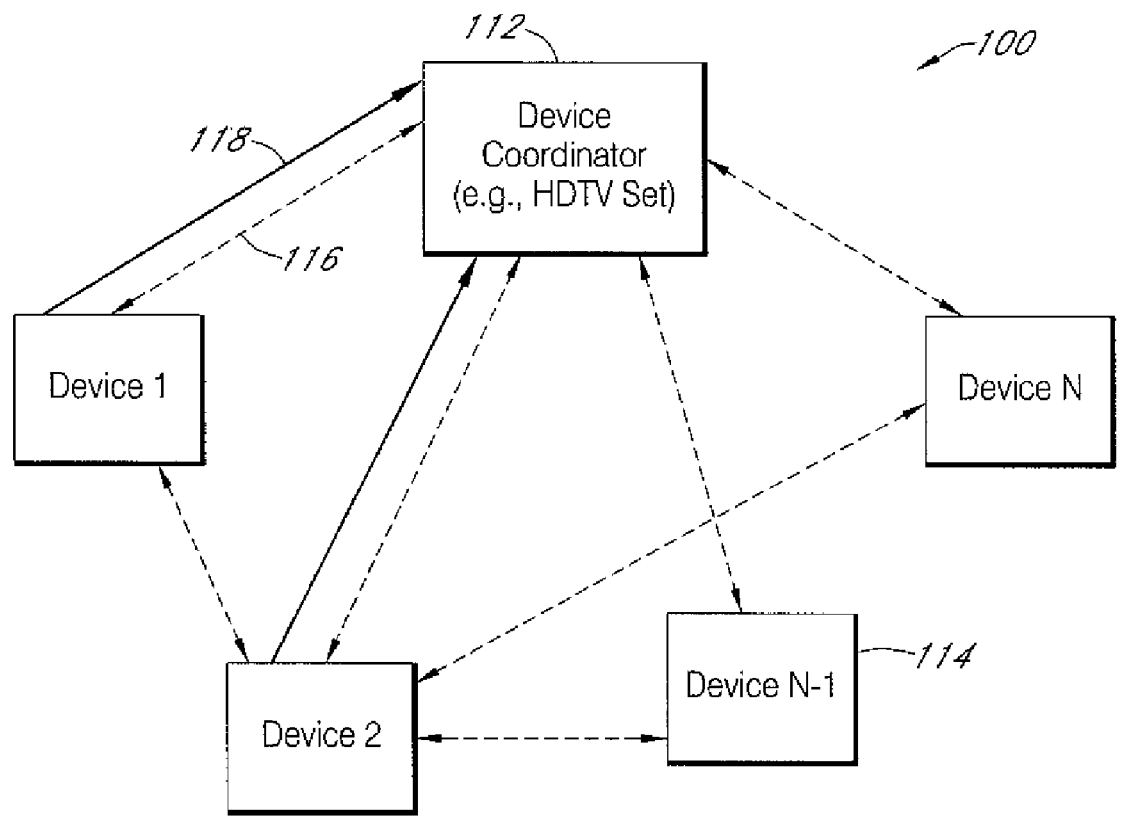
FIG. 1 is a functional block diagram of a wireless network that implements uncompressed HD video transmission between wireless devices according to one embodiment.

Example implementations of the embodiments in a wireless high definition (HD) audio/video (A/v) system will now be described. FIG. 1 shows a functional block diagram of a wireless network 100 that implements uncompressed HD video transmission between A/V devices such as an A/V device coordinator and A/V stations, according to certain embodiments. In other embodiments, one or more of the devices can be a computer, such as a personal computer (PC). The network 100 includes a device coordinator 112 and multiple A/V stations 114 (e.g., Device 1, Device 2, . . . , Device N). The A/V stations 114 utilize a low-rate (LR) wireless channel 116 (dashed lines in FIG. 1), and may use a high-rate (HR) channel 118 (heavy solid lines in FIG. 1), for communication between any of the devices. The device coordinator 112 uses a low-rate channel 116 and a high-rate wireless channel 118, for communication with the stations 114.

Each station 114 uses the low-rate channel 116 for communications with other stations 114. The high-rate channel 118 supports single direction unicast transmission over directional beams established by beamforming, with e.g., multi-Gb/s bandwidth, to support uncompressed HD video transmission. For example, a set-top box can transmit uncompressed video to a HD television (HDTV) over the high-rate channel 118. The low-rate channel 116 can support bi-directional transmission, e.g., with up to 40 Mbps throughput in certain embodiments. The low-rate channel 116 is mainly used to transmit control frames such as acknowledgement (ACK) frames. For example, the low-rate channel 116 can transmit an acknowledgement from the HDTV to the set-top box. It is also possible that some low-rate data like audio and compressed video can be transmitted on the low-rate channel between two devices directly. Time division duplexing (TDD) is applied to the high-rate and low-rate channel. At any one time, the low-rate and high-rate channels cannot be used in parallel for transmission, in certain embodiments. Beamforming technology can be used in both low-rate and high-rate channels. The low-rate channels can also support omni-directional transmissions.

In one example, the device coordinator 112 is a receiver of video information (hereinafter "receiver 112"), and the station 114 is a sender of the video information (hereinafter "sender 114"). For example, the receiver 112 can be a sink of video and/or audio data implemented, such as, in an HDTV set in a home wireless network environment which is a type of WLAN. In another embodiment, the receiver 112 may be a projector. The sender 114 can be a source of uncompressed video or audio. Examples of the sender 114 include a set-top box, a DVD player or recorder, digital camera, camcorder, other computing device (e.g., laptop, desktop, PDA, etc.) and so forth.

Figure 2:
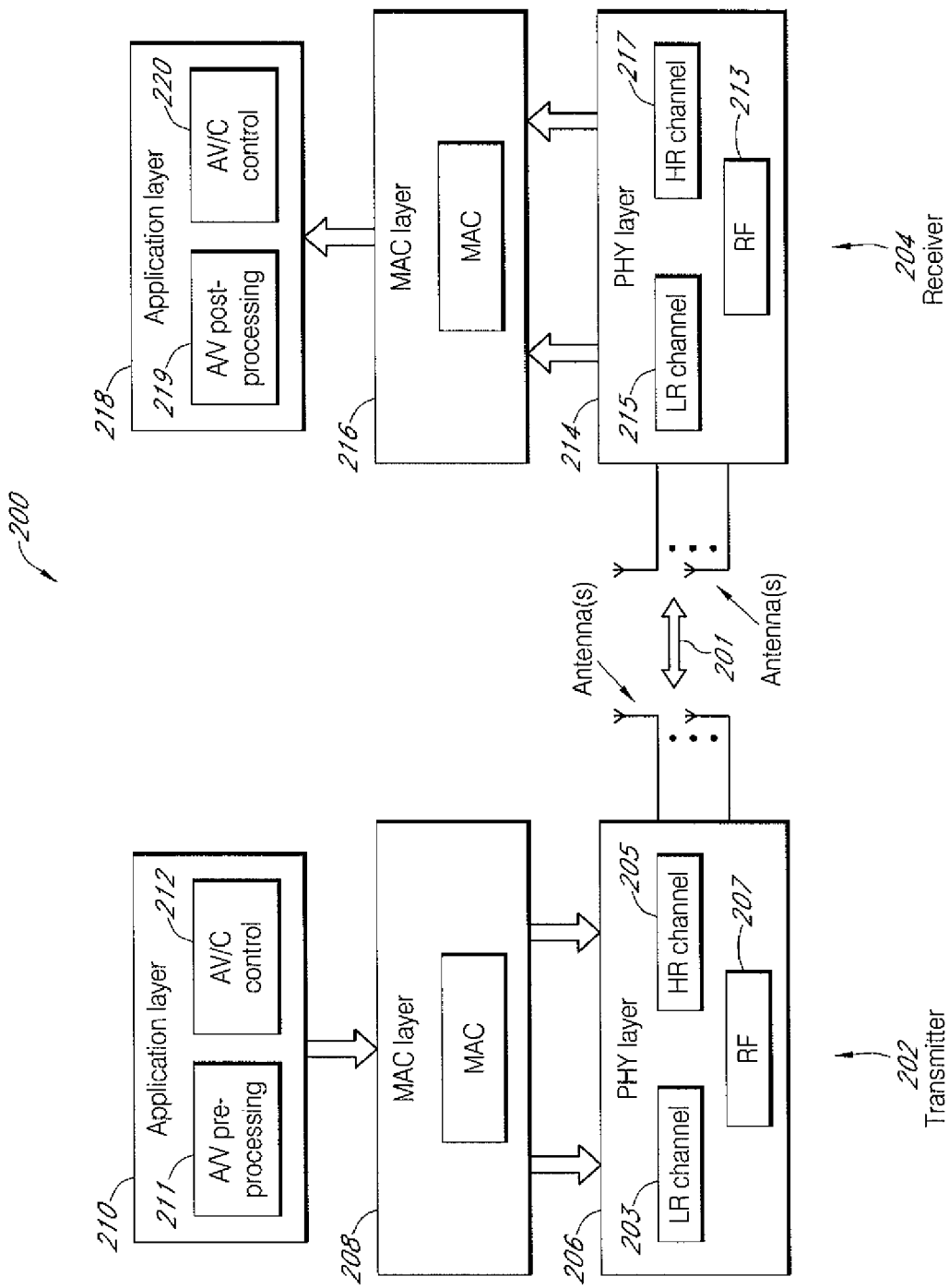
FIG. 2 is a functional block diagram of an example communication system for transmission of uncompressed HD video over a wireless medium, according to one embodiment.

FIG. 2 illustrates a functional block diagram of an example communication system 200. The system 200 includes a wireless transmitter 202 and wireless receiver 204. The transmitter 202 includes a physical (PHY) layer 206, a media access control (MAC) layer 208 and an application layer 210. Similarly, the receiver 204 includes a PHY layer 214, a MAC layer 216, and an application layer 218. The PHY layers provide wireless communication between the transmitter 202 and the receiver 204 via one or more antennas through a wireless medium 201.

The application layer 210 of the transmitter 202 includes an A/V pre-processing module 211 and an audio video control (AV/C) module 212. The A/V pre-processing module 211 can perform pre-processing of the audio/video such as partitioning of uncompressed video. The AV/C module 212 provides a standard way to exchange A/V capability information. Before a connection begins, the AV/C module negotiates the A/V formats to be used, and when the need for the connection is completed, AV/C commands are used to stop the connection.

In the transmitter 202, the PHY layer 206 includes a low-rate (LR) channel 203 and a high rate (HR) channel 205 that are used to communicate with the MAC layer 208 and with a radio frequency (RF) module 207. In certain embodiments, the MAC layer 208 can include a packetization module (not shown). The PHY/MAC layers of the transmitter 202 add PHY and MAC headers to packets and transmit the packets to the receiver 204 over the wireless channel 201.

In the wireless receiver 204, the PHY/MAC layers 214, 216 process the received packets. The PHY layer 214 includes a RF module 213 connected to the one or more antennas. A LR channel 215 and a HR channel 217 are used to communicate with the MAC layer 216 and with the RF module 213. The application layer 218 of the receiver 204 includes an A/V post-processing module 219 and an AV/C module 220. The module 219 can perform an inverse processing method of the module 211 to regenerate the uncompressed video, for example. The AV/C module 220 operates in a complementary way with the AV/C module 212 of the transmitter 202.

Figure 3:
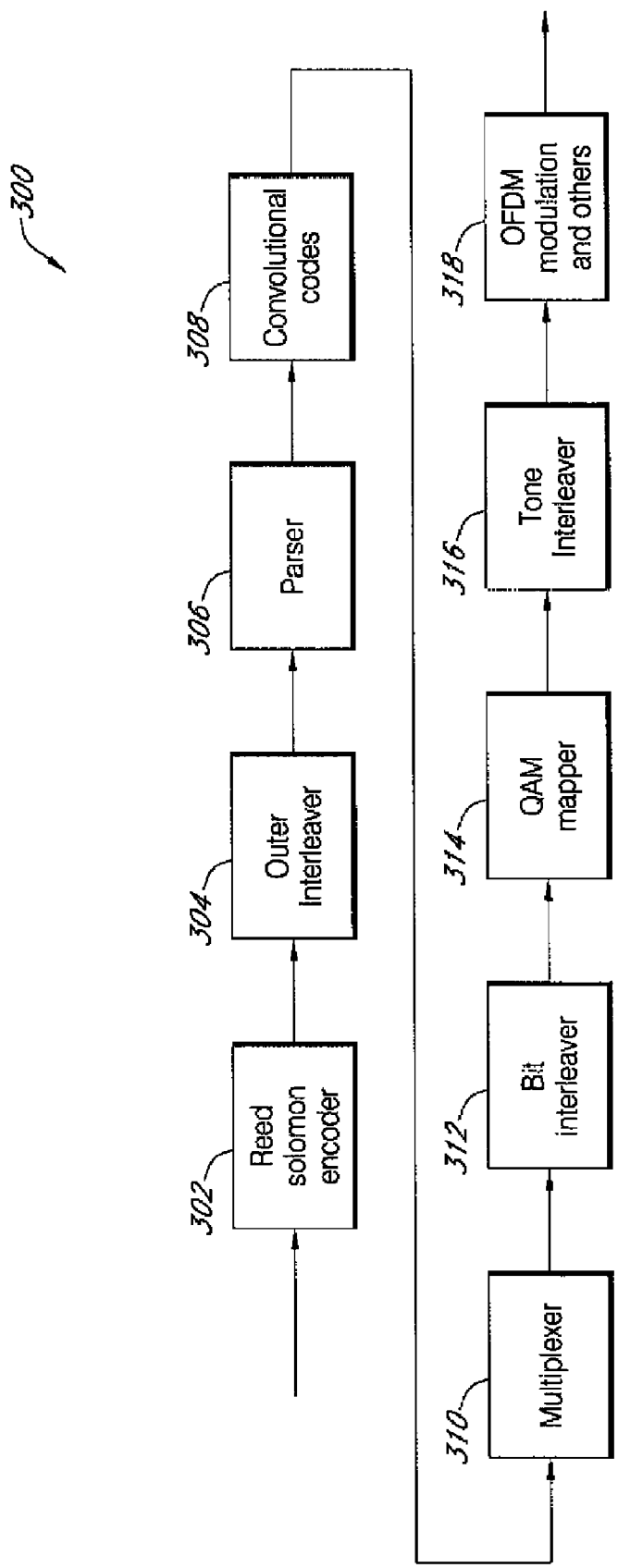
FIG. 3 illustrates a typical wireless HD video transmitter system.

FIG. 3 illustrates a typical wireless HD video transmitter system 300, which can be applied to at least one embodiment of the invention. The system 300 may include a Reed Solomon (RS) encoder 302, an outer interleaver 304, a parser 306, convolutional encoders 308, a multiplexer 310, a bit interleaver 312, a quadrature amplitude modulation (QAM) mapper 314, a tone interleaver 316 and a unit 318. In one embodiment, all of the elements of the FIG. 3 system 300 belong to the PHY layer 206 (see FIG. 2).

In one embodiment, instead of using the RS encoder 302, other outer encoders such as a BCH (Bose, Ray-Chaudhuri, Hocquenghem) encoder can also be used. In one embodiment, instead of using the convolutional encoders 308, other inner encoders such as a linear block encoder can also be used.

The RS encoder 302 and outer interleaver 304 perform RS encoding and outer interleaving with respect to incoming bit streams, respectively. In one embodiment, the outer interleaver 304 is a block interleaver or a convolutional interleaver. In another embodiment, other forms of interleavers are also possible.

The parser 306 and multiplexer 310 are generally used in order to accommodate multiple convolutional encoders for a single RS encoder and a single outer interleaver. The parser 306 parses the outer interleaved data bits to the convolutional encoders 308. That is, the parser 306 performs the serial-to-parallel conversion between the outer interleaver 304 and the convolutional encoders 308. The multiplexer 310 multiplexes the encoded data and provides the multiplexed data to the bit interleaver 312. That is, the multiplexer 310 performs the parallel-to-serial conversion between the convolutional encoders 308 and the bit interleaver 312.

The convolutional encoders 308 perform convolutional encoding for incoming (parsed) data bits. In one embodiment, the convolutional encoders 308 provide equal error protection for all incoming data bits. In another embodiment, the convolutional encoders 308 provide unequal error protection (UEP) for all incoming data bits.

In one embodiment, the RS encoder 302, outer interleaver 304 and the convolutional encoders 308 together perform the forward error correction (FEC) described with respect to FIG. 2.

The bit interleaver 312 performs bit interleaving for the mutlipelxed data stream in order to improve the overall PHY performance. The outputs of the bit interleaver 312 are provided to the I and Q branches of the QAM mapper 314. The QAM mapper 312 performs QAM mapping for the received data. The tone interleaver 316 may perform certain tone (e.g., length 512 tone) interleaving on the QAM mapped data. The unit 318 may perform orthogonal frequency division multiplexing (OFDM) and other functions (such as beamforming). After beamforming, the data packet is transmitted to a WiHD video data receiver over the wireless channel 201 (see FIG. 2). In one embodiment, the WiHD video data receiver may include a single convolutional decoder or a plurality of convolutional decoders corresponding to the convolutional encoder(s) of the transmitter system 300.

Generally, in wireless HD applications, there are three modes, one is unequal error protection-coding (UEP-coding) mode, another is the unequal error protection-modulation (UEP-modulation) mode, and the other is equal error protection (EEP) mode. Take overall eight parallel convolutional encoders, for example. In the EEP and UEP-modulation modes, all convolutional encoders share a common code rate, e.g., 2/3. In the UEP-coding mode, the first four convolutional encoders may use one code rate, e.g., 4/7, and the other four convolutional encoders may use another code rate, e.g., 4/5. It is noted that in the UEP-coding case, the upper branch (the first four encoders) and the lower branch (the other four encoders) are asymmetric in terms of number of encoded bits.

In one typical design of a multiplexer and a bit interleaver, a bit by bit multiplexer is assumed and certain bit interleaving patterns can be used. Disadvantage of this design is that it does not support the UEP case.

Another design of a multiplexer is proposed in a puncture-cycle based multiplexer design in U.S. patent application Ser. No. 11/724,760 filed on Mar. 15, 2007 entitled "System and method for digital communication having puncture cycle based multiplexing scheme with unequal error protection (UEP).". However, with respect to equal error protection (EEP), the multiplexer of the above application simplifies to a simple bit-by-bit multiplexer. In this application, when QAM modulation order is a factor of the number of convolutional encoders, the bit-by-bit multiplexer will suffer from "QAM-order" problem, i.e., long runs of weakly protected bits being observed at the input of a certain Viterbi decoder.

Another design of a multiplexer is proposed in U.S. patent application Ser. No. 11/776,506 filed on Jul. 11, 2007 entitled "System and method for processing high definition video data to be transmitted over a wireless medium.". Disadvantage of this design is that, the group multiplexer may not perform well enough in the EEP case, because different bits in a single QAM (e.g. 16QAM) symbol can come from the same convolutional encoder, which may degrade the overall PHY performance.

One embodiment of the invention provides a wireless HD video transmitter system which includes a group multiplexer and a circulant bit interleaver which can effectively improve the physical layer performance, as well as simplify hardware complexity. In one embodiment, the system can be used for both EEP and UEP (coding and modulation) modes.

Figure 4:
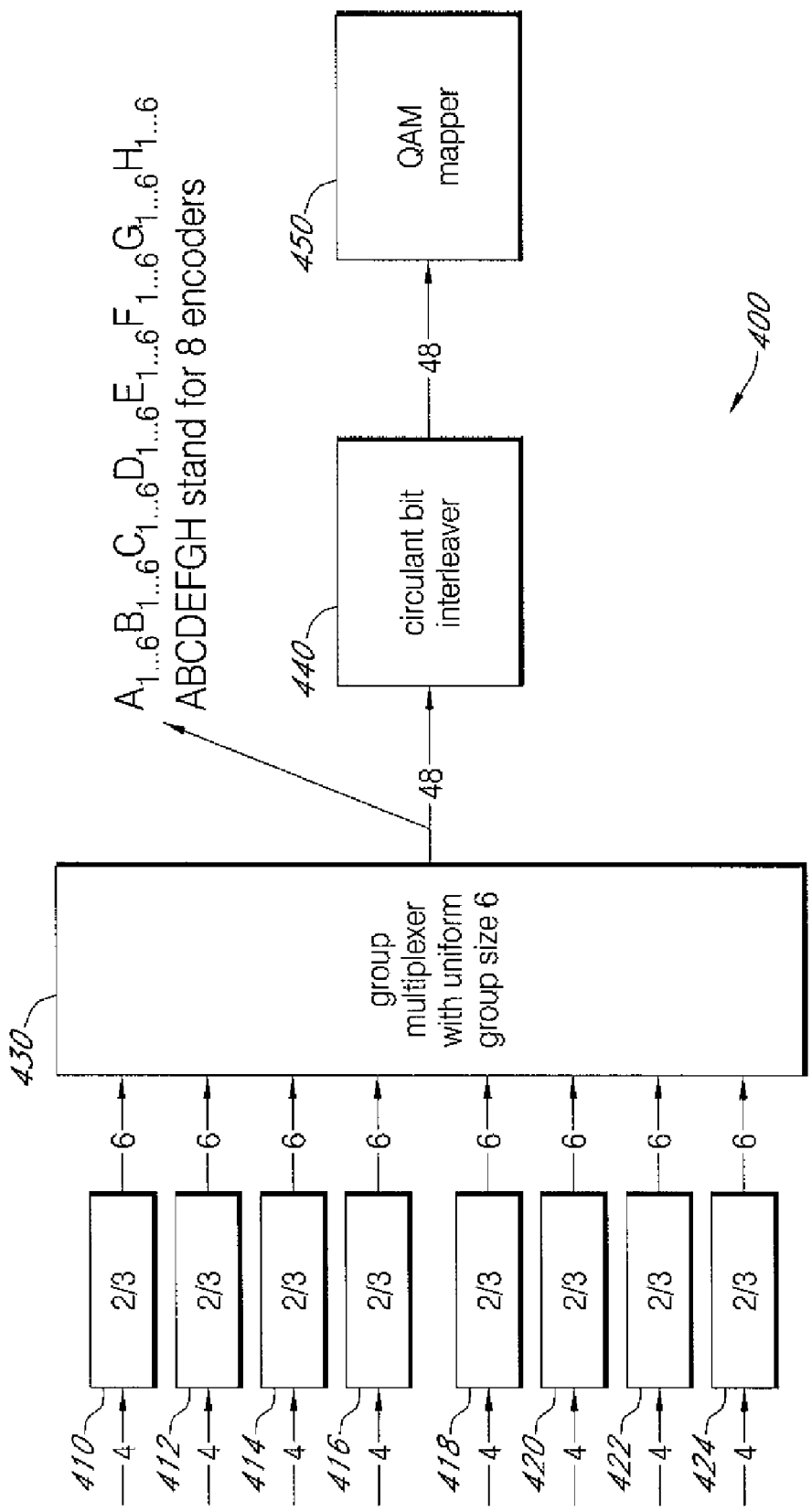
FIG. 4 illustrates an exemplary wireless HD video transmitter system for EEP and UEP modulation modes according to one embodiment of the invention.

FIG. 4 illustrates an exemplary wireless HD video transmitter system 400 for EEP and UEP modulation modes according to one embodiment of the invention. In one embodiment, the system 400 includes convolutional encoders (or other outer encoders; hereinafter will be frequently used as convolutional encoders for convenience) 410-424, a group multiplexer 430, a circulant bit interleaver 440 and a QAM mapper 450. In this embodiment, eight convolutional encoders 410-424 (or ABCDEFGH) are used for convenience. It is appreciated that different numbers of convolutional encoders or outer encoders can also be used. In one embodiment, the code rates for the convolutional encoders 410-424 is 2/3 as shown in FIG. 4. However, different code rates may also be used.

In one embodiment, the multiplexer group size is 6 for all of the convolutional encoders 410-424. In this embodiment, the group multiplexer 430 multiplexes six data bits together at one time. A description of a group multiplexer is provided in U.S. patent application Ser. No. 11/776,506 filed on Jul. 11, 2007. It is appreciated that this is merely an example and different multiplexer group sizes are also possible.

In one embodiment, the circulant bit interleaver 440 performs bit interleaving for the multiplexed data stream with, for example, size 48 and possibly different interleaving patterns. In one embodiment, the followings are considered in order to have a common size for all bit interleavers for EEP, UEP modulation and UEP coding modes.

First, it may be a factor of 336, which is the number of data subcarriers in one OFDM symbol. Second, for the EEP and UEP-modulation cases, it is a multiple of 2×8, where 8 is the total number of convolutional encoders. Third, for the UEP-coding case, it is a multiple of 2×12, where 12=7+5 is the total number of encoded bits for at least one pair of different codes over one cycle. In one embodiment, a bit interleaver with size 48 is used, as it is the smallest number that satisfies the above three factors. However, other interleaver sizes are also possible, following the same principle.

In one embodiment, in designing the bit interleaver 440, the following two criteria may be considered.

Criterion 1: For each convolutional code, if 16QAM modulation is used, adjacent bits are mapped to most significant bit (MSB) and least significant bit (LSB) of QAM constellation alternatively. Such a criterion may not be needed if the modulation becomes quadrature phase shift keying (QPSK) or binary phase shift keying (BPSK). For example, if 16QAM is used, for encoded bits from encoder A (A1, A2, A3, A4, A5, A6), A1, A3 and A5 may be mapped to MSBs of 16QAM constellations and at the same time A2, A4 and A6 may be mapped to LSBs of 16QAM constellations. Alternatively, A1, A3 and A5 may be mapped to LSBs of 16QAM constellations and at the same time A2, A4 and A6 may be mapped to MSBs of 16QAM constellations.

Criterion 2: For each QAM symbol, all bits in one QAM symbol come from different convolutional encoders.

In one embodiment, after multiplexing, the incoming bits are numbered by 1 to 48 in sequential order, regardless of UEP or EEP case. In one embodiment, the final bit interleaver patterns are all in circulant manners. The above criteria and this feature apply to the UEP coding mode which will be described with respect to FIGS. 11-18. In another embodiment, the above criteria may be modified, other modulation technique may be used and other criteria may be added. In another embodiment, it is possible to use different interleaver sizes for three different operating modes, UEP-coding, UEP-mapping and EEP. Below, each mode will be described in greater detail. Again, it is appreciated that the parameters (e.g., multiplexing group size, code rate, the number of convolutional encoders) listed below are provided by way of examples and other alternatives are also possible.

Bit Interleaver in EEP Mode

In one embodiment, the multiplexing group size is 6 on each branch. In this embodiment, the input of the circulant bit interleaver 440 is ordered as A1-A6, B1-B6, C1-C6, D1-D6, E1-E6, F1-F6, G1-G6, H1-H6 as shown in Table 1. Because of the sequential numbering, bits A1-A6 are numbered as 1-6, bits B1-B6 are numbered as 7-12, bits C1-C6 are numbered as 13-18, bits D1-D6 are numbered as 19-24, bits E1-E6 are numbered as 25-30, bits F1-F6 are numbered as 31-36, bits G1-G6 are numbered as 37-42, and finally bits H1-H6 are numbered as 43-48 as shown in Table 1.

TABLE 1

| bits  | numbering |
|-------|-----------|
| A1-A6 | 1-6       |
| B1-B6 | 7-12      |
| C1-C6 | 13-18     |
| D1-D6 | 19-24     |
| E1-E6 | 25-30     |
| F1-F6 | 31-36     |
| G1-G6 | 37-42     |
| H1-H6 | 43-48     |

Figure 6:
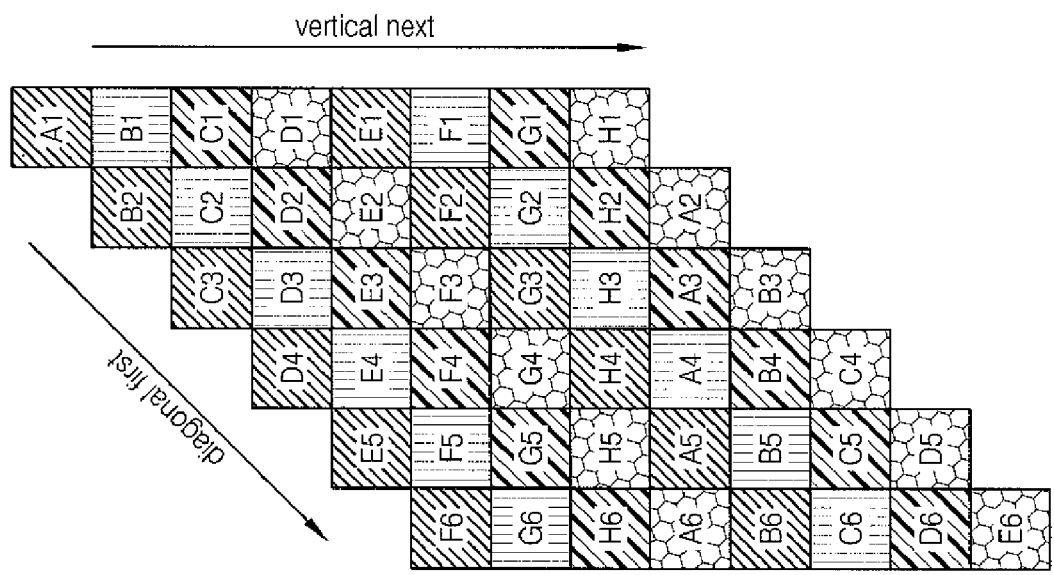
FIG. 6 illustrates a conceptual diagram showing the read out order of the circulant interleaver for the EEP mode.
Figure 5:
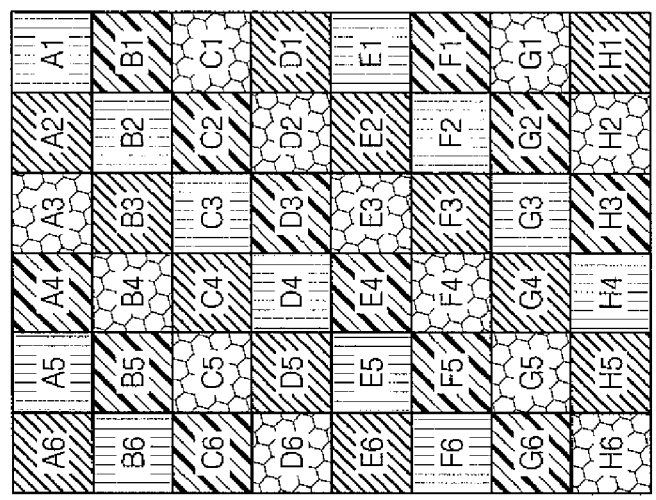
FIG. 5 illustrates a conceptual diagram showing input bits to a circulant interleaver for the EEP mode.

The total 48 bits naturally form a 6×8 bit stream block with 8 rows and 6 columns, as shown in FIG. 5. In one embodiment, all bits in the interleaver 440 are divided into eight streams, with each stream of length 6, spanning one anti-diagonal of the 6×8 block. For example, stream 1 includes bits A1 B2 C3 D4 E5 F6 as shown in FIG. 6.

In one embodiment, the circulant interleaver 440 works in such a way that the eight streams are read out sequentially from the first stream till the last stream, while each stream is read out sequentially from the head of the steam to the end of the stream. In this embodiment, each stream is read out completely before next stream is read out. Mathematically, each output stream can be represented by Equation 1.

$$\mathrm{mod}(([si, si+7\times1, si+7\times2, si+7\times3, si+7\times4, si+7\times5]-1), 48)+1 \qquad (Eq.\ 1)$$

In Equation 1, $si=6\times i-5$ is the starting index of the ith stream, where $i=1, \ldots, 8$. In this embodiment, the output order of the bit interleaver 440 is given as follows:

A1 B2 C3 D4 E5 F6 B1 C2 D3 E4 F5 G6 C1 D2 E3 F4 G5 H6 D1 E2 F3
G4 H5 A6 E1 F2 G3 H4 A5 B6 F1 G2 H3 A4 B5 C6 G1 H2 A3 B4 C5
D6 H1 A2 B3 C4 D5 E6.

In one embodiment, referring to FIGS. 5 and 6, the bit interleaver 440 interleaves data bits in a circulant manner. For example, in the bit stream (D1 E2 F3 G4 H5 A6), after interleaving the first five bits (D1 E2 F3 G4 H5) in the 6×8 block of FIG. 5, the bit interleaver 440 goes to the last bit A6 which is located in the top left corner of the block. Thereafter, the bit interleaver 440 comes back to and interleaves the first four bits (E1 F2 G3 H4) of the next bit stream (E1 F2 G3 H4 A5 B6) of the FIG. 5 block. The same applies to the following three bit streams (F1 G2 H3 A4 B5 C6, G1 H2 A3 B4 C5 D6 and H1 A2 B3 C4 D5 E6). It is seen from FIG. 5 that the bit interleaver 440 interleaves bits diagonally and in a circulant manner with respect to the 6×8 block. This applies to the remaining embodiments.

Numerically the output order takes a form as follows:

1, 8, 15, 22, 29, 36, 7, 14, 21, 28, 35, 42, 13, 20, 27, 34, 41, 48, 19, 26, 33, 40, 47, 6, 25, 32, 39, 46, 5, 12, 31, 38, 45, 4, 11, 18, 37, 44, 3, 10, 17, 24, 43, 2, 9, 16, 23, 30

In another embodiment, in closed form, let x=1 to 48 be the index (sequence) at the input of the bit interleaver 440, and y=1, . . . , 48 is the index (sequence or order) at the output of the bit interleaver 440 as represented by Equation 2. In Equation 2, the floor represents removing all numbers after decimal point (e.g., floor (3.24)=3, floor (3.79)=3).

$$y=\text{mod}(\text{floor}((x-1)/6)\times 6-5\times\text{mod}(x-1,6),48)+1 \quad \text{(Eq. 2)}$$

The output bits from the bit interleaver 440 are then mapped to QAM constellation as usual. In one embodiment, in 16 QAM, every four bits are mapped to a 16QAM symbol, e.g., {A1, B2, C3, D4} will form a 16QAM symbol, with {A1, B2} occupying the I branch and {C3, D4} occupying the Q branch of the QAM mapper 450. In another embodiment, {A1, B2} may occupy the Q branch and {C3, D4} may occupy the I branch of the QAM mapper 450.

Figure 7:
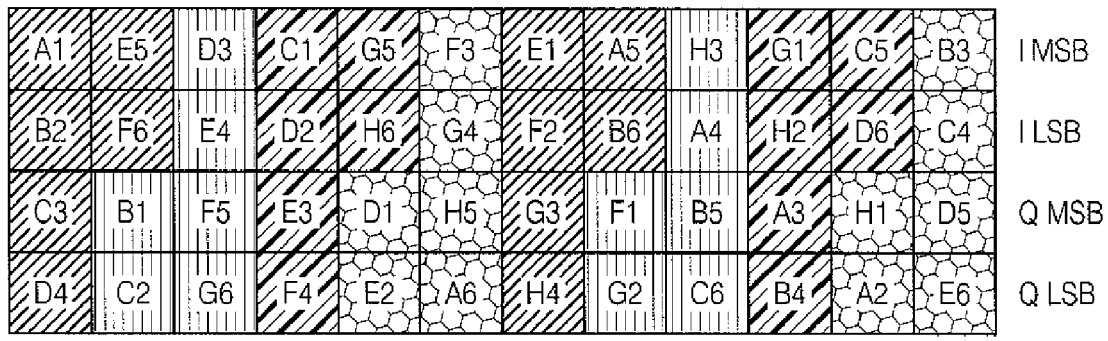
FIG. 7 illustrates a conceptual diagram showing the 16QAM constellation mapping of the interleaved bits for the EEP mode.

It can be easily verified that in the EEP mode, for each convolutional code, adjacent bits are mapped to MSB and LSB of 16QAM constellation alternatively as shown in FIG. 7 (associated with Criterion 1). Furthermore, bits in one QAM symbol always come from different encoders (associated with Criterion 2) as seen from FIG. 6.

Bit Interleaver in UEP-Modulation Mode

In one embodiment, the multiplexing group size is 6 on each branch. In this embodiment, the input of the bit interleaver 440 is ordered as A1-A6, B1-B6, C1-C6, D1-D6, E1-E6, F1-F6, G1-G6, H1-H6 as shown in Table 2. Because of the sequential numbering, bits A1-A6 are numbered as 1-6, bits B1-B6 are numbered as 7-12, bits C1-C6 are numbered as 13-18, bits D1-D6 are numbered as 19-24, bits E1-E6 are numbered as 25-30, bits F1-F6 are numbered as 31-36, bits G1-G6 are numbered as 37-42, and finally bits H1'-H6 are numbered as 43-48 as shown in Table 2.

TABLE 2

| bits | numbering |
| --- | --- |
| A1-A6 | 1-6 |
| B1-B6 | 7-12 |
| C1-C6 | 13-18 |
| D1-D6 | 19-24 |
| E1-E6 | 25-30 |
| F1-F6 | 31-36 |
| G1-G6 | 37-42 |
| H1-H6 | 43-48 |

Figure 8:
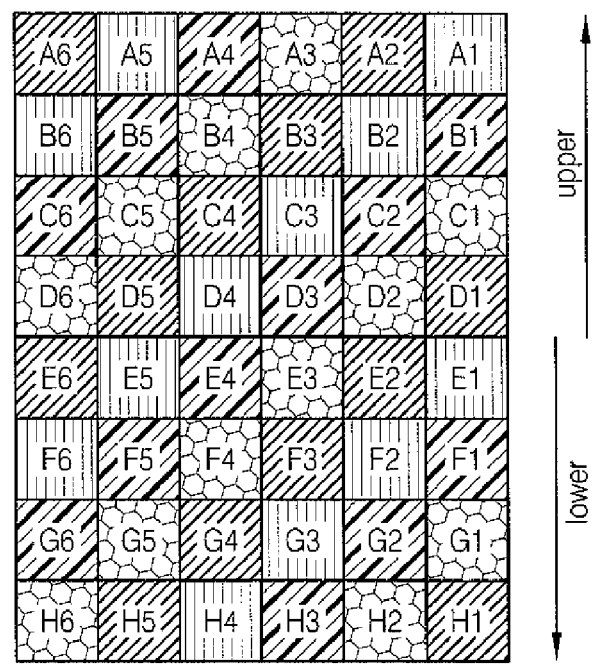
FIG. 8 illustrates a conceptual diagram showing input bits to a circulant interleaver for the UEP modulation mode.

The total 48 bits naturally form a 6×8 bit stream block with 8 rows and 6 columns, as shown in FIG. 8. In one embodiment, this UEP-mapping mode is different from the other two cases (EEP and UEP coding modes) in that the branch (I, Q) information is maintained, which will be used for UEP modulation in the QAM mapper 450. In this embodiment, the 6×8 block is divided into two parts as shown in FIGS. 9A and 9B: the upper four branches (FIG. 9A) which correspond to the output of encoders ABCD and are provided to, for example, the I branch of the QAM mapper 450, and the lower four branches (FIG. 91B) which correspond to the output of encoders EFGH and are provided to, for example, the Q branch of the QAM mapper 450. In one embodiment, in the UEP-modulation mode, another criterion may be considered in addition to the previous two criteria:

Criterion 3) Encoded bits from branch ABCD are mapped to the I branch of the QAM modulation and encoded bits from branch BEGH are mapped to the Q branch of the QAM modulation.

In another embodiment, encoded bits from branch ABCD may be mapped to the Q branch of the QAM mapper 450 and encoded bits from branch EFGH may be mapped to the I branch of the QAM mapper 450.

In this embodiment, circulant interleaving is performed separately in each half, in similar manner. For example, the first half is divided into four streams, with the first stream is A1, B2, C3, D4, A5, B6, the second stream is B1, C2, D3, A4, B5, C6, the third stream is C1, D2, A3, 14, C5, D6, and the fourth stream is D1, A2, B3, C4, D5, A6. The same principle applies to the lower four branches.

In one embodiment, for each half, the four streams are read out sequentially from the first stream till the last stream, while each stream is sequentially read out from the head of the stream to the end of the stream. Each stream is read out completely before next stream is read out. In this embodiment, the four streams from the upper part will go to the I branch only, while the four streams from the lower branch will go to the Q branch only.

In one embodiment, mathematically, let x=1, . . . , 48 be the index at the input of the bit interleaver 440, and y=1, . . . , 48 is the index at the output of the bit interleaver 440 as represented by Equation 3.

$$y=\text{mod}(\text{floor}((x-1)/6)\times 6-5\times\text{mod}(x-1,6),24)+1 \quad \text{(Eq. 3)}$$

The interleaved data bits may be provided to the I branch (for encoders ABCD on the upper 4 branches) as well as to the Q branch (for encoders EFGH on the lower 4 branches). It is noted that the only difference between Equations (2) and (3) is to replace 48 by 24. Together with the fact that Equations (2) and (4) (will be described later) are the same, the digital logic design for bit interleavers can be significantly simplified for all three different cases.

In another embodiment, to achieve similar PHY performance, many interleaver patterns can be implemented based on criteria 1, 2, and 3. Furthermore, it is possible to use different interleaver sizes for three different operating modes, UEP-coding, UEP-mapping and EEP.

Bit Interleaver in UEP-Coding Mode

Figure 11:
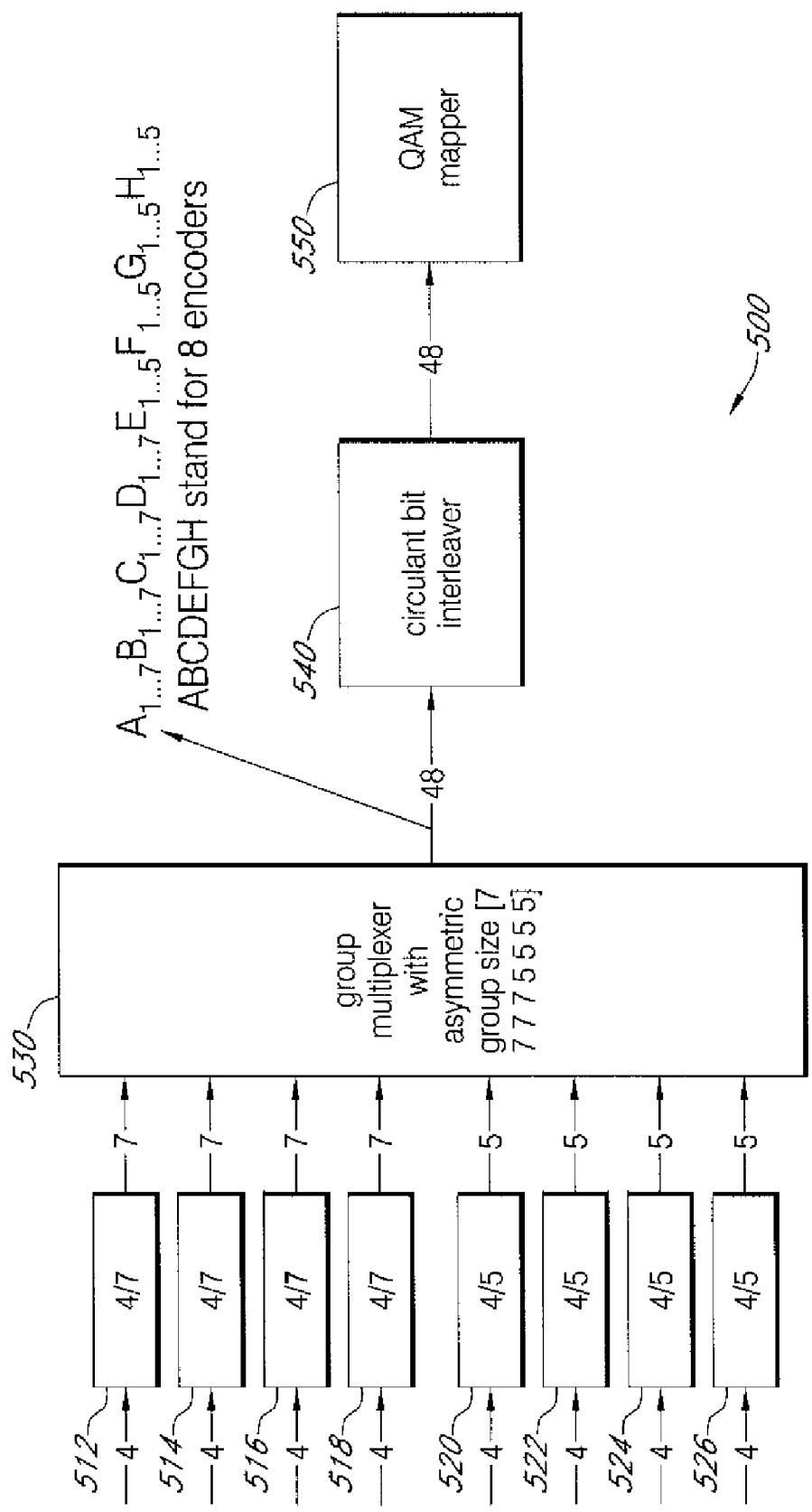
FIG. 11 illustrates an exemplary wireless HD video transmitter system for UEP coding mode according to one embodiment of the invention.

FIG. 11 illustrates an exemplary wireless HD video transmitter system 500 for UEP coding mode according to one embodiment of the invention. In one embodiment, in the UEP-coding case, the multiplexer group size (based on the puncture-cycle) is 7 for the first four convolutional encoders with a code rate, for example, 4/7, and the group size (based on the puncture-cycle) is 5 for the other four convolutional encoders with a code rate, for example, 4/5.

In one embodiment, the system 500 includes convolutional encoders 512-526, a group multiplexer 530, a circulant bit interleaver 540 and a QAM mapper 550. In this embodiment, eight convolutional encoders 512-524 (or ABCDEFGH) are used for convenience. It is appreciated that different numbers of convolutional encoders or outer encoders may also be used.

Due to the multiplexing group size 7 for the top four branches and size 5 for the lower four branches, the input of the circulant bit interleaver 540 is ordered as A1-A7, B1-B7, C1-C7, D1-D7, E1-E5, F1-F5, G1-G5, H1-H5 as shown in Table 3. Because of the sequential numbering, bits A1-A7 are numbered as 1-7, bits B1-B7 are numbered as 8-14, bits C1-C7 are numbered as 15-21, bits D1-D7 are numbered as 22-28, bits E1-E5 are numbered as 29-33, bits F1-F5 are numbered as 34-38, bits G1-G5 are numbered as 39-43, and finally bits H1-H5 are numbered as 44-48 as shown in Table 3.

TABLE 3

| Bits  | numbering |
|-------|-----------|
| A1-A7 | 1-7       |
| B1-B7 | 8-14      |
| C1-C7 | 15-21     |
| D1-D7 | 22-28     |
| E1-E5 | 29-33     |
| F1-F5 | 34-38     |
| G1-G5 | 39-43     |
| H1-H5 | 44-48     |

Figure 12B:
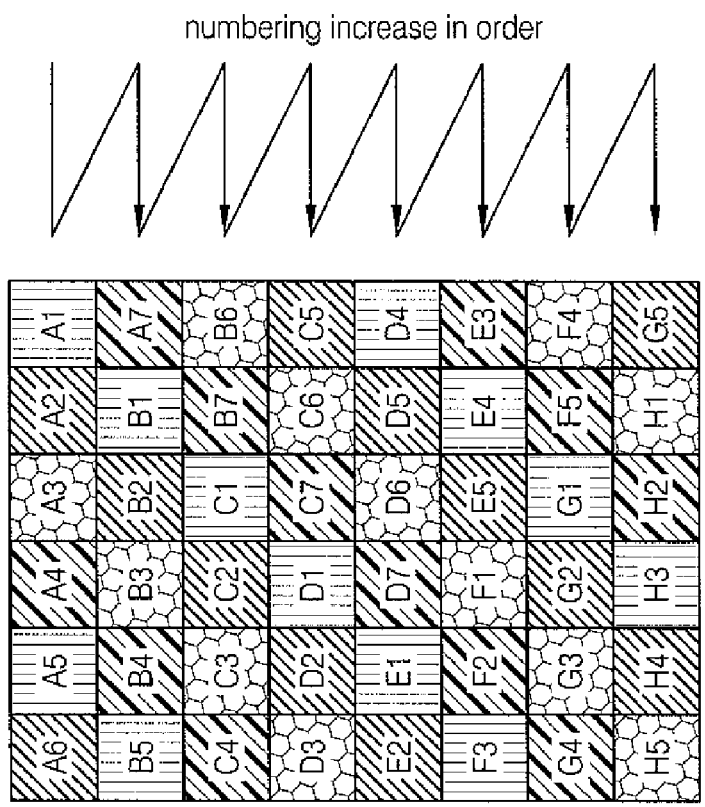
FIG. 12B illustrates a conceptual diagram showing input bits (after forcing into a 6 by 8 block form) to a circulant interleaver for the UEP coding mode.
Figure 12A:
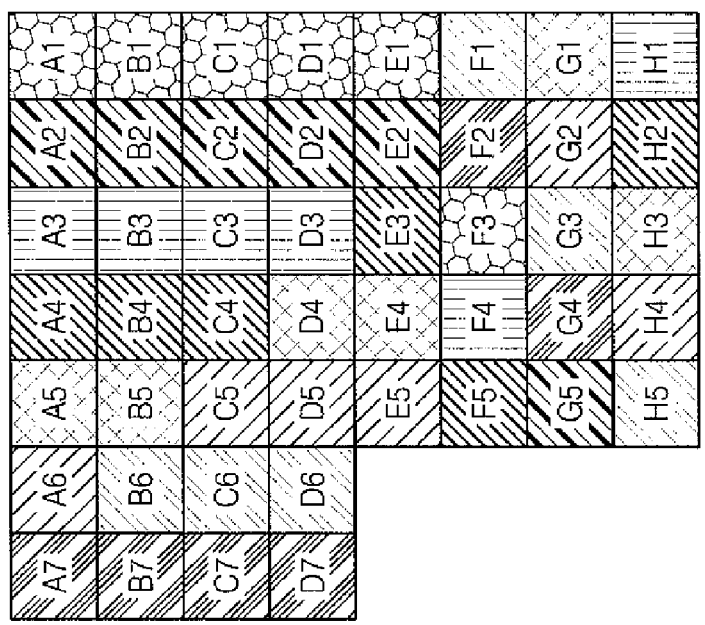
FIG. 12A illustrates a conceptual diagram showing input bits (natural order right after the encoder outputs) to a circulant interleaver for the UEP coding mode.
Figures 13, 14:
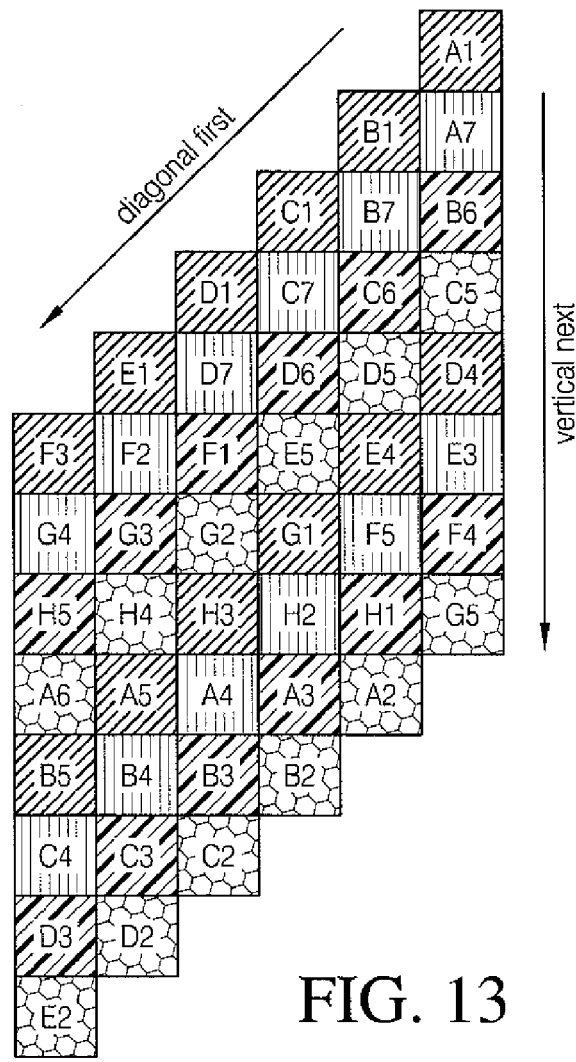
FIG. 13 illustrates a conceptual diagram showing the read out order for the circulant interleaver for the UEP coding mode.
FIG. 14 illustrates a conceptual diagram showing the 16QAM constellation mapping of the interleaved bits for the UEP coding mode.

Referring to FIG. 12A, natural order right after the encoder outputs is illustrated where there are upper four rows (7×4) and lower four rows (5×4). In one embodiment, thereafter, the two smaller blocks are converted to a 6×8 bit stream block with 8 rows and 6 columns in such a way that the input bits numbering increase along the zigzag as shown in FIG. 12B. Exactly the same as in FIGS. 5 and 6, all bits in the interleaver 540 are divided into 8 streams, with each stream of length 6, spanning one anti-diagonal of the 6×8 block. For example, stream 1 includes bits A1 B1 C1 D1 E1 F3. As shown in FIG. 13, because of the difference between the UEP-coding mode and EEP mode, the exact labeling for each stream is different from FIG. 6. For example, the first bit stream in the EEP mode is A1 B2 C3 D4 E5 F6 whereas the first bit stream in the UEP coding mode A1 H1 C1 D1 E1 F3. This is because in the EEP mode, the multiplexing group size is 6 for all bit streams whereas the multiplexing group sizes are 7 and 5 for the first four and the last four bit streams, respectively.

In one embodiment, the same interleaver can be used for both of the two (UEP coding and EEP) modes. The circulant interleaver 540 works in such a way that the eight streams are read out sequentially from the first stream till the last stream, while each stream is read out sequentially from the head of the steam to the end of the stream as shown in FIGS. 12B and 13. Each stream is read out completely before the next stream is read out.

In one embodiment, mathematically, let x=1 to 48 be the index at the input of the bit interleaver 540, and y=1, ..., 48 is the index at the output of the bit interleaver 540 as represented by Equation 4. As discussed above, Equations 2 and 4 are the same.

$$y = \mod(\text{floor}((x-1)/6) \times 6 - 5 \times \mod(x-1,6), 48) + 1 \quad \text{(Eq. 4)}$$

The output bits from the bit interleaver 540 are then mapped to QAM constellation. In one embodiment, in 16 QAM, every four bits are mapped to a 16QAM symbol, e.g., {A1, B1, C1, D1} may form a 16QAM symbol, with {A1, B1} occupying the I branch of the QAM mapper 550 and {C1, D1} occupying the Q branch of the QAM mapper 550. In another embodiment, {A1, B1} may occupy the Q branch and {C1, D1} may occupy the I branch of the QAM mapper 550.

It can be easily verified from FIGS. 13 and 14 that in the UEP-coding case, for each convolutional code, adjacent bits are mapped to MSB and LSB of QAM constellation alternatively (Criterion 1). Furthermore, bits in one QAM symbol always come from different encoders (Criterion 2).

Additional Embodiment of Bit Interleaver in UEP-Coding Mode

FIG. 15 illustrates a conceptual diagram showing numbering and labeling of the multiplexing scheme for the UEP coding mode (first half cycle) according to another embodiment of the invention. This embodiment further improves the PHY performance of the embodiment described with respect to FIGS. 11-14 where among the upper four encoders A-D, encoders A and C may receive slightly better performance than encoders B and D. The same observation can be made for the lower four encoders. Among encoders E-H, encoders F and G may receive slightly better performance than encoders F and H. For example, regarding the bit stream A1-A7, four bits (A1, A6, A7 and A3) receive an MSB error protection where as three bits (A2, A4 and A5) receive an LSB error protection as shown in FIG. 14. The same applies to the remaining bit streams (B-E). This can cause the above minor performance difference.

In one embodiment, the performance difference is removed among encoders in the same branch (either top branch containing encoders A, B, C and D, or bottom branch containing encoders E, F, G and H) as follows. In one embodiment, instead of performing bit interleaving using a single bit interleaving pattern with a period of 48, bit interleaving using two slightly different bit interleaving patterns (see FIGS. 15 and 17) are used, each with a period of 48. In one embodiment, the two bit interleaving patterns are used alternatively, and thus the overall bit interleaving pattern has a period of 96. In this embodiment, two different memories (or two different bit interleaving sections) may be used for each bit interleaving cycle corresponding to a period of 48. In this embodiment, the bit interleaving sections may interleave data bits during the first and second half cycles, respectively. In this embodiment, the two cycles may be subsequent (one of the two cycles occurring first, and the other half cycle occurring thereafter), substantially simultaneous or at least partially overlap with each other.

In another embodiment, a single memory (or a single bit interleaver) may be used for both of the bit interleaving cycles. In this embodiment, the size of the single memory corresponds to a period of 48 and may use time division technique in accessing the memory. In this embodiment, the two cycles may be subsequent to each other.

In one embodiment, the length 96 period is divided into two half cycles, each with length 48. The bit interleaving patterns in these two cycles are separately illustrated with respect to 1) FIGS. 15, 16 and 2) FIGS. 17 and 18. In one embodiment, the bit interleaving pattern in the first half cycle is substantially the same as the bit interleaving pattern described with respect to FIGS. 12-14. In one embodiment, an alternative bit interleaving pattern is added for the second half cycle.

In one embodiment, in the UEP coding mode, the top four encoders (or encoders A, B, C, D) use, for example, a convolutional code rate 4/7, and the bottom four encoders (or encoders E, F, G, H) use, for example, a convolutional code rate 4/5. The encoded bits are multiplexed and bit interleaved every 96 bits. The total length of 96 bits are divided into two half cycles, with each half cycle multiplexing and interleaving 48 bits, in a slightly different way to compensate the performance difference as described above.

First Half Cycle

In one embodiment, in the first half cycle, a group multiplexer with a group size of 7, 7, 7, 7, 5, 5, 5, 5 for eight encoders is used. Referring to FIG. 15, this first half cycle uses A1, A2, A3, A4, A5, A6, A7 to label the 7 encoded bits (in increasing order in time) from encoder A, and similarly B1 through B7, C1 through C7, D1 through D7, E1 through E5, F1 through F5, G1 through G5, and H1 through H5 from encoders B, C, D, E, F, G, and H, respectively. At the output of the multiplexer 530, the 48 encoded bits are ordered and numbered as shown in FIG. 15.

The multiplexed 48 bits are then sent to the bit interleaver 540. In one embodiment, let x=1, ..., 48 be the index at the input of the bit interleaver 540, and y=1, ..., 48 be the index at the output of the bit interleaver 540 as reflected in Equation 5:

$$y=\mathrm{mod}(6\times\mathrm{floor}(x-1/6)-5\times\mathrm{mod}(x-1,6),48)+1. \quad \text{(Eq. 5)}$$

Overall, in the first half cycle, the read out order of the interleaver 540 is illustrated in FIG. 16. The 48 interleaved bits are then mapped to different constellations. In the QPSK case, every consecutive two bits may form a QPSK symbol, with the first symbol mapping to the I branch, and the second symbol mapping to the Q branch. In the 16 QAM case, every consecutive four bits may form a 16 QAM symbol, with the first two symbols mapping to the I branch, and the last two symbols mapping to the Q branch of the QAM mapper 550.

In one embodiment, at the receiver side, after demodulation, the received bits are deinterleaved. Let y=1, ..., 48 be the index at the input of the bit deinterleaver, and then z=1, ..., 48 is the index at the output of the bit deinterleaver as reflected in Equation 6:

$$z=\mathrm{mod}(6\times\mathrm{floor}(y-1/6)+7\times\mathrm{mod}(y-1,6),48)+1 \quad \text{(Eq. 6)}$$

Second Half Cycle

In one embodiment, in the second half cycle, the group multiplexer 530 with a group size of 7, 7, 7, 7, 5, 5, 5, 5 for all eight encoders 512-526 is used. Referring to FIG. 16, this second half cycle uses A8, A9, A10, A11, A12, A13, A14 to label the 7 encoded bits (in increasing order in time) from encoder A, and similarly B8 through B14, C8 through C14, D8 through D14, E6 through E10, F6 through F10, G6 through G10, and H6 through H10 from encoders B, C, D, E, F, G, and H, respectively. At the output of the multiplexer 530, the 48 encoded bits are ordered and numbered as shown in FIG. 17.

The multiplexed 48 bits are then sent to the bit interleaver 540. Let x=1, ..., 48 be the index at the input of the bit interleaver, and then y=1, ..., 48 is the index at the output of the bit interleaver as reflected in Equation 7.

$$y=\mathrm{mod}(6\times\mathrm{floor}(x-1/6)-5\times\mathrm{mod}(x-1,6),48)+1 \quad \text{(Eq. 7)}$$

Overall, in the second half cycle, the read out order of the interleaver 540 is illustrated in FIG. 18. The 48 interleaved bits are then mapped to different constellations. In the QPSK case, every consecutive two bits may form a QPSK symbol, with the first symbol mapping to the I branch, and the second symbol mapping to the Q branch. In the 16 QAM case, every consecutive four bits may form a 16 QAM symbol, with the first two symbols mapping to the I branch, and the last two symbols mapping to the Q branch of the QAM mapper 550.

In one embodiment, the performance difference described above is removed by providing the two half cycles. Regarding the bit stream (A), during the first half cycle, four bits (A1, A6, A7 and A3) receive an MSB error protection where as three bits (A2, A4 and A5) receive an LSB error protection as shown in FIG. 16. However, during the second half cycle, three bits (A4, A6 and A2) receive an MSB error protection where as four bits (A7, A3, A1 and A5) receive an LSB error protection as shown in FIG. 18. The same applies to the remaining bit streams (B-E). That is, the second half cycle compensates the asymmetric error protection of the first half cycle.

In one embodiment, at the receiver side, after demodulation, the received bits are deinterleaved. Let y=1, ..., 48 be the index at the input of the bit deinterleaver, and then z=1, ..., 48 is the index at the output of the bit deinterleaver as reflected in Equation 8.

$$z=\mathrm{mod}(6\times\mathrm{floor}(y-1/6)+7\times\mathrm{mod}(y-1,6),48)+1 \quad \text{(Eq. 8)}$$

Figure 19:
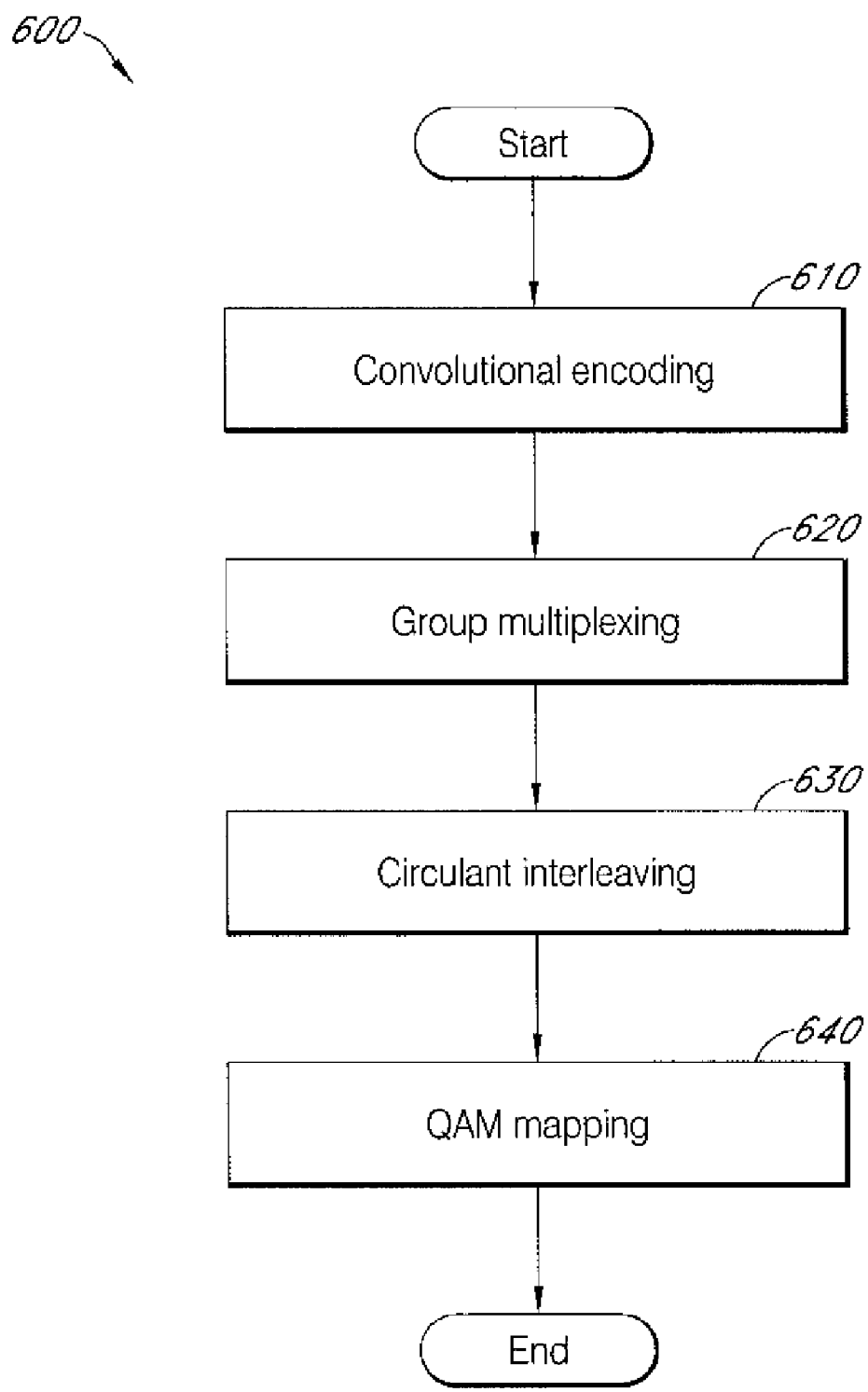
FIG. 19 is a flowchart for a transmitting procedure according to one embodiment of the invention.

FIG. 19 is a flowchart for a transmitting procedure 600 according to one embodiment of the invention. In one embodiment, the transmitting procedure 600 is implemented in a conventional programming language, such as C or C++ or another suitable programming language. In one embodiment of the invention, the program is stored on a computer accessible storage medium at a WiHD transmitter, for example, a device coordinator 112 or devices (1-N) 114 as shown in FIG. 1. In another embodiment, the program can be stored in other system locations so long as it can perform the transmitting procedure 600 according to embodiments of the invention. The storage medium may comprise any of a variety of technologies for storing information. In one embodiment, the storage medium comprises a random access memory (RAM), hard disks, floppy disks, digital video devices, compact discs, video discs, and/or other optical storage mediums, etc.

In another embodiment, at least one of the device coordinator 112 and devices (1-N) 114 comprises a processor (not shown) configured to or programmed to perform the transmitting procedure 600. The program may be stored in the processor or a memory of the coordinator 112 and/or the devices (1-N) 114. In various embodiments, the processor may have a configuration based on Intel Corporation's family of microprocessors, such as the Pentium family and Microsoft Corporation's Windows operating systems such as Windows 95/98/2000/XP or Windows NT. In one embodiment, the processor is implemented with a variety of computer platforms using a single chip or multichip microprocessors, digital signal processors, embedded microprocessors, microcontrollers, etc.

In another embodiment, the processor is implemented with a wide range of operating systems such as Unix, Linux, Microsoft DOS, Microsoft Windows 2000/9x/ME/XP, Macintosh OS, OS/2 and the like. In another embodiment, the transmitting procedure 600 can be implemented with an embedded software. Depending on the embodiments, additional states may be added, others removed, or the order of the states changes in FIG. 19. In FIG. 19, certain states (e.g., functions associated with the elements 302-306 and 316-318 in FIG. 3) are omitted.

In state 610, convolutional encoding (or inner encoding) for incoming data bits is performed, for example, in the convolutional encoders 410-424 or 512-526 (or other inner encoders). A description regarding the operation of convolutional encoders in WiHD is explained in U.S. patent application Ser. No. 11/724,758 filed on Mar. 15, 2007 entitled "System and method for digital communication using multiple parallel encoders," which is incorporated herein by reference.

In state 620, group multiplexing is performed, for example, in the group multiplexer 430 or 530. A description of group multiplexing for UEP is provided in U.S. patent application Ser. No. 11/724,760 filed on Mar. 15, 2007, which is incorporated herein by reference. A description of group multiplexing for EEP is provided in U.S. patent application Ser. No. 11/776,506 filed on Jul. 11, 2007, which is incorporated herein by reference.

In state 630, circulant bit interleaving is performed in, for example, in the circulant bit interleaver 440 or 540. Thereafter, QAM mapping is performed in, for example, in the QAM mapper 450 or 550.

According to at least one embodiment, the circulant bit interleaver is common for both unequal error protection and equal error protection coding case, and incurs only slight modification for the unequal error protection modulation case. Also, the interleaving patterns demonstrate a high regularity, thus simplifying the digital logic design. Furthermore, the overall PHY performance is highly boosted compared to no-bit-interleaving case. At least one embodiment provides a group multiplexer that easily differentiates the UEP and EEP case, as well as a bit interleaver, that is effective in both EEP and UEP cases. Furthermore, the interleaver patterns are highly consistent across UEP-coding, UEP-modulation and EEP modes.

While the above description has pointed out novel features of the invention as applied to various embodiments, the skilled person will understand that various omissions, substitutions, and changes in the form and details of the device or process illustrated may be made without departing from the scope of the invention. For example, although embodiments of the invention have been described with reference to uncompressed video data, those embodiments can be applied to compressed video data as well. Therefore, the scope of the invention is defined by the appended claims rather than by the foregoing description. All variations coming within the meaning and range of equivalency of the claims are embraced within their scope.

What is claimed is:

1. A system for processing high definition video data to be transmitted over a wireless medium, the system comprising:
   a plurality of convolutional encoders configured to input a plurality of video data streams and output a plurality of encoded data streams, respectively, wherein each data stream includes a plurality of data bits;
   a group multiplexer configured to multiplex the plurality of encoded data streams into a multiplexed data stream based on a first multiplexor group size for a first portion of the plurality of encoded data streams and a second multiplexor group size for a second portion of the plurality of encoded data streams, wherein the group multiplexer is further configured to multiplex a plurality of data bits together at one time;
   a circulant bit interleaver configured to receive an m×n data stream block having n columns and m rows or convert the multiplexed data stream to an m×n data stream block, wherein the m×n data stream block comprises m×n data bits, and wherein the bit interleaver is further configured to interleave the received data bits diagonally and in a circulant manner with respect to the m×n block; and
   a quadrature amplitude modulation (QAM) mapper configured to perform QAM mapping for the interleaved data.

2. The system of claim 1, wherein the circulant bit interleaver is further configured to interleave the multiplexed data bits such that all data bits in one QAM symbol come from different convolutional encoders.

3. The system of claim 2, wherein the circulant bit interleaver is further configured to provide the interleaved data bits to the QAM mapper such that adjacent bits are mapped to most significant bit (MSB) and least significant bit (LSB) of QAM constellation alternatively.

4. The system of claim 3, wherein the plurality of convolutional encoders are further configured to encode the plurality of video data streams with a same code rate.

5. The system of claim 4, wherein the circulant bit interleaver is further configured to:
   1) receive an 8×6 input data stream block, wherein the 8×6 input block comprises first to eighth rows each of which includes six data bits (A1-A6, B1-B6, C1-C6, D1-D6, E1-E6, F1-F6, G1-G6 and H1-H6) and 2) read out the 8×6 input data block diagonally first and vertically next starting from A1 so as to output a 48-bit output data stream (A1B2C3D4E5F6, B1C2D3E4F5G6, C1D2E3F4G5H6, D1E2F3G4H5A6, E1F2G3H4A5B6, F1G2H3A4B5C6, G1H2A3B4C5D6, H1A2B3C4D5E6).

6. The system of claim 4, wherein the QAM mapper is further configured to provide unequal error protection modulation for the interleaved data bits, wherein the circulant bit interleaver is further configured to:
   1) receive an 8×6 input data stream block, wherein the 8×6 input block comprises first to eighth rows each of which includes six data bits (A1-A6, B1-B6, C1-C6, D1-D6, E1-E6, F1-F6, G1-G6 and H1-H6) and
   2) read out the 8×6 input data block diagonally first and vertically next starting from A1 so as to output i) a first 24-bit output data stream (A1B2C3D4A5B6, B1C2D3A4B5C6, C1D2A3B4C5D6, D1A2B3C4D5A6) for one of the I and Q branches of the QAM mapper and ii) a second 24-bit output data stream (E1F2G3H4E5F6, F121H3E4F5G6, G1H2E3F4G15H6, H1E2F3G4H5E6) for the other branch of the QAM mapper.

7. The system of claim 3, wherein the plurality of convolutional encoder are further configured to encode a portion of the plurality of video data streams with a first code rate and encode the remaining portion of the plurality of video data streams with a second code rate different from the first code rate.

8. The system of claim 7, wherein the circulant bit interleaver is further configured to:
   1) receive i) a 4×7 input data stream block, wherein the 4×7 input block comprises first to fourth rows each of which includes seven data bits (A1-A7, B1-B7, C1-C7, D1-D7) and ii) a 4×5 input data stream block, wherein the 4×5 input block comprises first to fourth rows each of which includes five data bits (E1-E5, F1-F5, G1-G5, H1-H5),
   2) convert the two blocks to an 8×6 data stream block, wherein the 8×6 block comprises first to eighth rows each of which includes six data bits (A1A2A3A4A5A6, A7B1B2B3B4B5, B6B7C1C2C3C4, C5C6C7D1D2D3, D4D5D6D7E1E2, E3E4E5F1F2F3, F4F5G1G2G3G4, G5H1H2H3H4H5) and
   3) read out the 8×6 converted data block diagonally first and vertically next starting from A1 so as to output a 48-bit output data stream (A1B1C1D1E1F3, A7B7C7D7F2G4, B6C6D6F1G3H5, C5D5E5G2H4A6, D4E4G1H3A5B5, E3F5H2A4B4C4, F4H1A3B3C3D3, G5A2B2C2D2E2).

9. The system of claim 7, wherein the circulant bit interleaver is, during a first half cycle, further configured to:
   1) obtain a first 8×6 data stream block, wherein the first 8×6 block comprises first to eighth rows each of which includes six data bits (A1A2A3A4A5A6, A7B1B2B3B4B5, B6B7C1C2C3C4, C5C6C7D1D2D3, D4D5D6D7E1E2, E3E4E5F1F2F3, F4F5G11C2G3G4, G5H1H2H3H4H5) and
   2) read out the first 8×6 data block diagonally first and vertically next starting from A1 so as to output a 48-bit output data stream (A1B1C1D1E1F3, A7B7C7D7F2G4, B6C6D6F1G3H5, C5D5E5G2H4A6, D4E4G1H3A5B5, E3F5H2A4B4C4, F4H1A3B3C3D3, G5A2B2C2D2E2), and wherein the circulant bit interleaver is, during a second half cycle, further configured to:
1) obtain a second 8×6 data stream block, wherein the second 8×6 block comprises first to eighth rows each of which includes six data bits (A8A9A10A11A12A13, A14B8B9B10B11B12, B13B14C8C9C10C11, C12C13C14D8D9D10, D10D12D13D14E6E7, E8E9E10F6F7F8, F9F10G6G7G8G9, G01H6H7H8H9H10) and
2) read out the second 8×6 data block diagonally first and vertically next starting from B8 so as to output a 48-bit output data stream (B8C8D8A8F8G8, B14C14D14A14G7H9, C13D13A13G6H8E10, D12A12F10H7E9B913, A11F9H6E8B12C12, F8G10E7B11C11D11, G9E6B10C10D10A10, H10B9C9D9A9F7).

10. The system of claim 9, wherein one of the first and second half cycles occurs first, and the other half cycle occurs thereafter.

11. The system of claim 9, wherein the first and second half cycles at least partially overlap, in timing, with each other.

12. The system of claim 1, further comprising: a Reed Solomon (RS) encoder configured to RS encode an input bit stream into an RS encoded data stream; an outer interleaver configured to outer interleave the RS encoded data stream; and a parser configured to parse the outer interleaved data stream to the plurality of convolutional encoders, respectively.

13. The system of claim 1, wherein the system is implemented with one of the following: a set-top box, a DVD player or recorder, a digital camera, a camcorder and a computing device.

14. The system of claim 1, wherein the circulant bit interleaver is used for both an equal error protection (EEP) mode and an unequal error protection (UEP) mode.

15. The system of claim 1, wherein the circulant bit interleaver is further configured to divide the received data bits into a plurality of streams, and sequentially read out the plurality of streams from a first stream to a last stream.

16. The system of claim 15, wherein each stream is sequentially read out from a head of a stream to an end of a stream before a next stream is read out.

17. The system of claim 1, wherein the received m×n data stream block is ordered based on the first multiplexor group size and the second multiplexor group size.

18. A method of processing high definition video data to be transmitted over a wireless medium, the method comprising:
convolutional encoding a plurality of video data streams in parallel into a plurality of encoded data streams, wherein each data stream includes a plurality of data bits;
group multiplexing the plurality of encoded data streams into a multiplexed data stream based on a first multiplexor group size for a first portion of the plurality of encoded data streams and a second multiplexor group size for a second portion of the plurality of encoded data streams, wherein a plurality of data bits are multiplexed together at one time;
receiving an m×n data stream block having n columns and m rows or converting the multiplexed data stream to an m×n data stream block, wherein the m×n data stream block comprises m×n data bits;
interleaving the received data bits diagonally and in a circulant manner with respect to the m×n block; and
performing quadrature amplitude modulation (QAM) mapping for the interleaved data.

19. The method of claim 18, the interleaving comprises interleaving the multiplexed data bits such that all data bits in one QAM symbol come from different encoded data streams.

20. The method of claim 19, wherein the QAM mapping comprises mapping adjacent bits to most significant bit (MSB) and least significant bit (LSB) of QAM constellation alternatively.

21. The method of claim 20, wherein the convolutional encoding provides equal error protection for the received plurality of video data streams, and wherein the interleaving comprises:
receiving an 8×6 input data stream block, wherein the 8×6 input block comprises first to eighth rows each of which comprises six data bits (A1-A6, B1-B6, C1-C6, D1-D6, E1-E6, F1-F6, G1-G6 and H1-H6); and
reading out the 8×6 input data block diagonally first and vertically next starting from A1 so as to output a 48-bit output data stream (A1B2C3D4E5F6, B1C2D3E4F5G6, C1D2E3F4G5H6, D1E2F3G4H5A6, E1F2G3H4A5B6, F1G2H3A4B5C6, G1H2A3B4C5D6, H1A2B3C4D5E6).

22. The method of claim 20, wherein the QAM mapping provides unequal error protection modulation for the interleaved data bits, and wherein the interleaving comprises:
receiving an 8×6 input data stream block, wherein the 8×6 input block comprises first to eighth rows each of which includes six data bits (A1-A6, B1-B6, C1-C6, D1-D6, E1-E6, F1-F6, G1-G6 and H1-H6); and reading out the 8×6 input data block diagonally first and vertically next starting from A1 so as to output i) a first 24-bit output data stream (A1B2C3D4A5B6, B1C2D3A4B5C6, C1D2A3B4C5D6, D1A2B3C4D5A6) for one of the I and Q branches of the QAM mapper and ii) a second 24-bit output data stream (E1F2G3H4E5F6, F1G2H3E4F5G6, G1H2E3F4G5H6, H1E2F3G4H5E6) for the other branch of the QAM mapper.

23. The method of claim 20, wherein the convolutional encoding comprises:
encoding a portion of the plurality of video data streams with a first code rate; and
encoding the remaining portion of the plurality of video data streams with a second code rate different from the first code rate, and wherein the interleaving comprises:
receiving i) a 4×7 input data stream block, wherein the 4×7 input block comprises first to fourth rows each of which includes seven data bits (A1-A7, B1-B7, C1-C7, D1-D7) and ii) a 4×5 input data stream block, and wherein the 4×5 input block comprises first to fourth rows each of which includes five data bits (E1-E5, F1-F5, G1-G5, H1-H15);
converting the two blocks to an 8×6 data stream block, wherein the 8×6 block comprises first to eighth rows each of which includes six data bits (A1A2A3A4A5A6, A7B1B2B3B4B5, B6B7C1C2C3C4, C5C6C7D1D2D3, D4D5D6D7E1E2, E3E4E5F1F2F3, F4F5G1G2G3G4, G5H1H2H3H4H5); and
reading out the 8×6 converted data block diagonally first and vertically next starting from A1 so as to output a 48-bit output data stream (A1B1C1D1E1F3, A7B7C7D7F2G4, B6C6D6F1G3H5, C5D5E502H44A6, D4E4G1H3A5B5, E3F5H2A4B4C4, F4H1A3B3C3D3, G5A2B2C2D2E2).

24. The method of claim 20, wherein the convolutional encoding comprises: encoding a portion of the plurality of video data streams with a first code rate; and encoding the remaining portion of the plurality of video data streams with a second code rate different from the first code rate, and wherein the interleaving comprises:

obtaining, during a first half cycle, a first 8×6 data stream block, wherein the first 8×6 block comprises first to eighth rows each of which includes six data bits (A1A2A3A4A5A6, A7B1B2B3B4B5, B6B7C1C2C3C4, C5C6C7D1D2D3, D4D5D6D7E1E2, E3E4E5F1F2F3, F4F5G1G2G3G4, G5H1H2H3H4H5);

reading out, during the first half cycle, the first 8×6 data block diagonally first and vertically next starting from A1 so as to output a 48-bit output data stream (A1B1C1D1E1F3, A7B7C7D7F2G4, B6C6D6F1G3H5, C5D5E5G2H4A6, D4E4G1H3A5B5, E3F5H2A4B4C4, F4H1A3B3C3D3, G5A2B2C2D2E2);

obtaining, during a second half cycle, a second 8×6 data stream block, wherein the second 8×6 block comprises first to eighth rows each of which includes six data bits (A8A9A10A11A12A13, A14B8B9B10B11B12, B13B14C8C9C10C11, C12C13C14D8D9D10, D10D12D13D14E6E7, E8E9E10F6F7F8, F9F10G6G7G8G9, G10H6H7H8H9H10); and reading out, during the second half cycle, the second 8×6 data block diagonally first and vertically next starting from B8 so as to output a 48-bit output data stream (B8C8D8A8F8G8, B14C14D14A14G7H9, C13D13A13G6H8E10, D12A12F10H7E9B13, A11F9H6E8B12C12, F8G10E7B11C11D11, G9E6B10C10D10A10, H10B9C9D9A9F7).

25. The method of claim 24, wherein one of the first and second half cycles occurs first, and the other half cycle occurs thereafter.

26. The method of claim 24, wherein the first and second half cycles at least partially overlap, in timing, with each other.

27. One or more processor-readable storage devices having processor-readable code embodied on the processor-readable storage devices, the processor-readable code for programming one or more processors to perform a method of processing high definition video data to be transmitted over a wireless medium, the method comprising:

convolutional encoding a plurality of video data streams in parallel into a plurality of encoded data streams, wherein each data stream includes a plurality of data bits;

group multiplexing the plurality of encoded data streams into a multiplexed data stream based on a first multiplexor group size for a first portion of the plurality of encoded data streams and a second multiplexor group size for a second portion of the plurality of encoded data streams, wherein a plurality of data bits are multiplexed together at one time;

receiving an m×n data stream block having n columns and m rows or converting the multiplexed data stream to an m×n data stream block, wherein the m×n data stream block comprises m×n data bits;

interleaving the received data bits diagonally and in a circulant manner with respect to the m×n block; and performing quadrature amplitude modulation (QAM) mapping for the interleaved data.

28. A system for processing high definition video data to be transmitted over a wireless medium, the system comprising:

means for convolutional encoding a plurality of video data streams in parallel into a plurality of encoded data streams, wherein each data stream includes a plurality of data bits;

means for group multiplexing the plurality of encoded data streams into a multiplexed data stream based on a first multiplexor group size for a first portion of the plurality of encoded data streams and a second multiplexor group size for a second portion of the plurality of encoded data streams, wherein a plurality of data bits are multiplexed together at one time;

means for receiving an m×n data stream block having n columns and m rows or converting the multiplexed data stream to an m×n data stream block, wherein the m×n data stream block comprises m×n data bits;

means for interleaving the received data bits diagonally and in a circulant manner with respect to the m×n block; and means for performing quadrature amplitude modulation (QAM) mapping for the interleaved data.

29. A system for processing high definition video data to be transmitted over a wireless medium, the system comprising:

an outer encoder configured to outer encode a received video data stream into a first encoded data stream;

an outer interleaver configured to outer interleave the first encoded data stream;

a plurality of inner encoders configured to input a plurality of video data streams and output a plurality of encoded data streams, respectively, wherein each data stream includes a plurality of data bits;

a group multiplexer configured to multiplex the plurality of encoded data streams into a multiplexed data stream based on a first multiplexor group size for a first portion of the plurality of encoded data streams and a second multiplexor group size for a second portion of the plurality of encoded data streams, wherein the group multiplexer is further configured to multiplex a plurality of data bits together at one time;

a circulant bit interleaver configured to receive an m×n data stream block having n columns and m rows or convert the multiplexed data stream to an m×n data stream block, wherein the m×n data stream block comprises m×n data bits, and wherein the bit interleaver is further configured to interleave the received data bits diagonally and in a circulant manner with respect to the m×n block; and a quadrature amplitude modulation (QAM) mapper configured to perform QAM mapping for the interleaved data.

30. The system of claim 29, wherein the outer error encoder is a Reed Solomon (RS) encoder or a BCH encoder.

31. The system of claim 29, wherein each of the inner encoders is a convolutional encoder or a linear block encoder.

32. A system for processing high definition video data to be transmitted over a wireless medium, the system comprising:

a source for a data stream having a plurality of blocks of data; and a circulant bit interleaver configured to receive an m×n data stream block having n columns and m rows from the source or convert a received data block to an m×n data stream block, wherein the received m×n data stream block is ordered based on a first multiplexor group size and a second multiplexor group size, wherein the m×n data stream block comprises m×n data bits, and wherein the bit interleaver is further configured to interleave the received data bits diagonally and in a circulant manner with respect to the m×n block.

* * * * *